US009786620B2

(12) United States Patent
Kramp

(10) Patent No.: US 9,786,620 B2
(45) Date of Patent: Oct. 10, 2017

(54) SEMICONDUCTOR DEVICE AND A METHOD FOR MANUFACTURING A SEMICONDUCTOR DEVICE

(71) Applicant: Infineon Technologies AG, Neubiberg (DE)

(72) Inventor: Stefan Kramp, Villach (AT)

(73) Assignee: INFINEON TECHNOLGIES AG, Neubiberg (DE)

( * ) Notice: Subject to any disclaimer, the term of this patent is extended or adjusted under 35 U.S.C. 154(b) by 0 days.

(21) Appl. No.: 14/809,296

(22) Filed: Jul. 27, 2015

(65) Prior Publication Data

US 2017/0033067 A1    Feb. 2, 2017

(51) Int. Cl.
*H01L 23/00* (2006.01)
*H01L 21/768* (2006.01)

(52) U.S. Cl.
CPC ........ *H01L 24/06* (2013.01); *H01L 21/76832* (2013.01); *H01L 24/03* (2013.01); *H01L 24/27* (2013.01); *H01L 24/29* (2013.01); *H01L 24/45* (2013.01); *H01L 2224/48491* (2013.01); *H01L 2924/0105* (2013.01); *H01L 2924/01022* (2013.01); *H01L 2924/01029* (2013.01)

(58) Field of Classification Search
CPC .................. H01L 2924/00014; H01L 2924/00
USPC .......................... 257/751, 782, 528, 774, 737
See application file for complete search history.

(56) References Cited

U.S. PATENT DOCUMENTS

| | | | |
|---|---|---|---|
| 2006/0231951 A1* | 10/2006 | Jan | H01L 24/11 257/737 |
| 2008/0080112 A1* | 4/2008 | Lin | H01L 21/76816 361/56 |
| 2009/0117702 A1* | 5/2009 | Lin | H01L 23/5227 438/381 |
| 2011/0092000 A1* | 4/2011 | Coffy | G01R 1/0408 438/15 |
| 2014/0264865 A1 | 9/2014 | Schneegans et al. | |
| 2016/0027746 A1 | 1/2016 | Kramp et al. | |

* cited by examiner

*Primary Examiner* — Julio J Maldonado
*Assistant Examiner* — Rodolfo D Fortich
(74) *Attorney, Agent, or Firm* — Viering, Jentschura & Partner mbB

(57) ABSTRACT

According to various embodiments, a semiconductor device may include: at least one first contact pad on a front side of the semiconductor device; at least one second contact pad on the front side of the semiconductor device; a layer stack disposed at least partially over the at least one first contact pad, wherein the at least one second contact pad is at least partially free of the layer stack; wherein the layer stack includes at least an adhesion layer and a metallization layer; and wherein the metallization layer includes a metal alloy and wherein the adhesion layer is disposed between the metallization layer and the at least one first contact pad for adhering the metal alloy of the metallization layer to the at least one first contact pad.

25 Claims, 8 Drawing Sheets

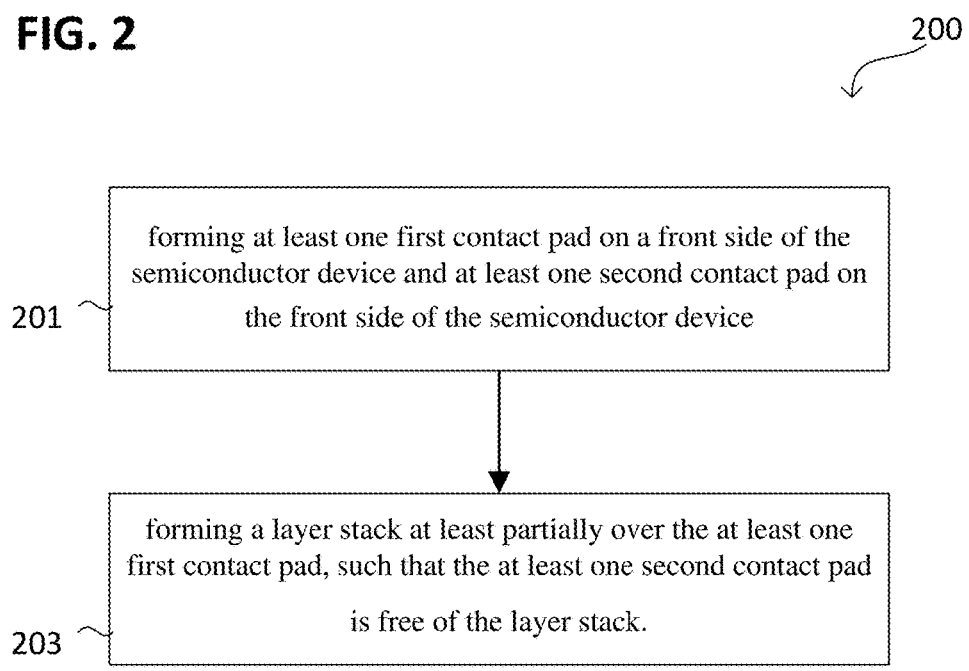

SEMICONDUCTOR DEVICE AND A METHOD FOR MANUFACTURING A SEMICONDUCTOR DEVICE

TECHNICAL FIELD

Various embodiments relate generally to a semiconductor device and a method for manufacturing a semiconductor device.

BACKGROUND

In general, a semiconductor device (e.g. an integrated circuit, also referred to as IC, chip, or microchip) may be processed in semiconductor technology on and/or in a substrate (also referred to as a wafer or a carrier). The substrate may include a plurality of semiconductor chips which are processed in corresponding regions of the substrate. For fabricating such semiconductor devices, certain electrical contacts are provided, e.g. using soldering.

Conventionally, lead based solder material is used in semiconductor technology to provide high temperature resistance and good mechanical properties of the achieved electrical contacts. However, lead is a toxic element which causes ecological damage and damage to health. Further, certain local provision of the law regulate (e.g. limit or forbid) the usage of lead containing solder material or plan to regulate its usage. Therefore, lead-free materials are desired to replace currently used lead based solder material in semiconductor technology.

Lead-free solder material complicates soldering processes, since its compatibility to conventional contact pads and semiconductor technology is smaller compared to lead based solder material. In most cases, lead-free solder material is limited in its temperature resistance and potentially melts during further processing the semiconductor device, e.g. during connecting the semiconductor device to a peripheral device, e.g. a circuit board. Further, lead-free solder material is limited in its capability to contact (e.g. fully wet) certain materials and tends to drip off from conventional contact pads and/or tends to form voids. This results in deficient electrical contacts causing potential malfunction of the corresponding semiconductor device. The front side contact pads of a semiconductor device require high precision soldering with narrow process tolerances, small contact areas, high electrical conductance, and high stability according to further process steps, which prevents the adaption of common lead-free solder techniques.

Conventionally, silver-epoxy adhesive is used to replace common lead based solder material in contacting processes. On the one hand, the silver-epoxy adhesive enables to use conventional equipment to dispense the silver-epoxy adhesive in analogy to solder material, which minimizes necessary changes in semiconductor processing. On the other hand, silver-epoxy adhesive is limited in contact reliability and its thermal resistance.

Alternatively, nickel (Ni) alloys are used to provide a solderable contact area, which in combination with tin (Sn) based solder materials (e.g. lead-free or also lead containing solder material) form NiSn intermetallic phases, which provide a good electrical and mechanical contact between Ni and the solder material. These nickel alloys may be used e.g. in the power device technology and/or in automotive technology. However, Ni requires an additional protection to avoid corrosion and an additional adhesion to the base metallization (e.g. Al(Si)Cu). For example, nickel oxide is hard to crack and prevents the formation of NiSn intermetallic phases. In the case of sputter deposition or in case of evaporation deposition, Ti is used as electrical contact and mechanical adhesion layer over AlCu or AlSiCu contact pads followed by a Ni or NiV layer as solderable compound material followed by Ag or Au as protection layer against nickel oxide formation.

SUMMARY

According to various embodiments, a semiconductor device may include: at least one first contact pad on a front side of the semiconductor device; at least one second contact pad on the front side of the semiconductor device; a layer stack disposed at least partially over the at least one first contact pad, wherein the at least one second contact pad is at least partially free of the layer stack; wherein the layer stack includes at least an adhesion layer and a metallization layer; and wherein the metallization layer includes a metal alloy and wherein the adhesion layer is disposed between the metallization layer and the at least one first contact pad for adhering the metal alloy of the metallization layer to the at least one first contact pad.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 2 shows a method according to various embodiments in a schematic flow diagram;

DESCRIPTION

Figure 1A:
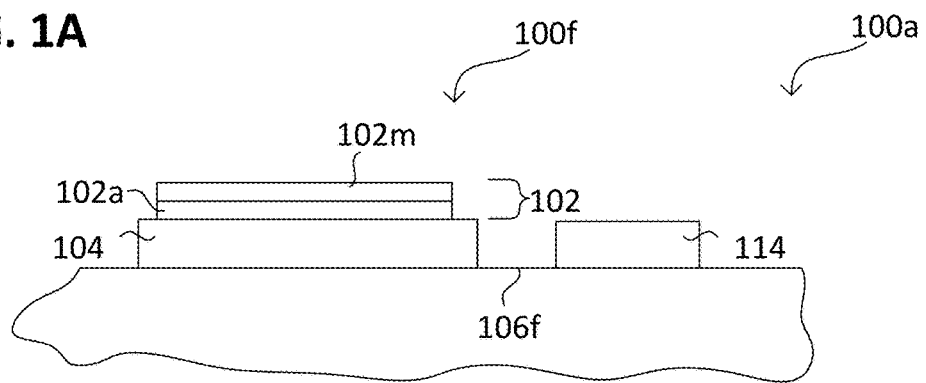
FIG. 1A to FIG. 1C respectively show a semiconductor device according to various embodiments in a cross-sectional view or a schematic side view in a method according to various embodiments.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The term "lateral" used with regards to the "lateral" extension of a structure (e.g. of a substrate or a film) or "laterally" next to, may be used herein to mean an extension or a positional relationship along a surface of a substrate, a wafer, or a carrier. That means that a surface of a substrate (also referred to as surface of a carrier, e.g. a surface of a wafer) may serve as reference, commonly referred to as the main processing surface (illustratively, on the top side also referred to as front side) of the substrate (or the main processing surface of the substrate, e.g. a wafer). Further, the term "width" used with regards to a "width" of a structure (or of a structure element) may be used herein to mean the lateral extension of a structure. Further, the term "height" or "depth" used with regards to a structure (or of a structure element), may be used herein to mean an extension of a structure along a direction perpendicular to the surface of a substrate (e.g. perpendicular to the main processing surface of a substrate). The term "thickness" used with regards to a "thickness" of a layer may be used herein to mean the spatial extension of the layer perpendicular to the surface of the support (the material) on which the layer is deposited. If the surface of the support is parallel to the surface of the substrate (e.g. to the main processing surface) the "thickness" of the layer deposited on the support may be the same as the height of the layer. Further, a "vertical" structure may be referred to as a structure extending in a direction perpendicular to the lateral direction (e.g. perpendicular to the main processing surface of a substrate) and a "vertical" extension may be referred to as an extension along a direction perpendicular to the lateral direction (e.g. an extension perpendicular to the main processing surface of a substrate).

The term "structuring" (also referred to as patterning) with regards to a layer, a material or a region may refer to form a structure (e.g. a desired shape or a desired pattern) into or from the layer, the material or the region. To structure the layer, the material or the region, material may be removed from the layer, the material or the region, e.g. using etching. To remove material from the layer, the material or the region a mask (providing a pattern) may be used, e.g. a mask that provides to remove material (e.g. to etch a structure) according to the pattern of the mask from the layer, the material or the region. Illustratively, the mask may prevent regions (which are designated to remain) from being removed (e.g. by etching). Alternatively or additionally, to structure the layer, the material or the region material may be disposed using a mask (providing a pattern). The mask may provide to form (e.g. dispose) material according to the pattern of the mask. Illustratively, the mask may prevent regions (which are designated to remain free) from being covered by the layer or the material. Forming a layer, a material or a region may include structuring the layer, the material or the region.

In general, removing material may include etching the material. The term "etching" may include various etching procedures, e.g. chemical etching (e.g. wet etching or dry etching), physical etching, plasma etching, ion etching etc. For etching a layer, a material or a region an etchant may be applied to the layer, the material or the region. For example, the etchant may react with the layer, the material or the region forming a substance (or chemical compound) which can be easily removed, e.g. a volatile substance. Alternatively or additionally, the etchant may for example, atomize the layer, the material or the region.

According to various embodiments, the semiconductor device may include one or more integrated circuit structures (also referred to as semiconductor chip, IC, chip, or microchip) which are formed during semiconductor device fabrication (in other words, in a method for forming a semiconductor device). The integrated circuit structures may be processed at least partially on and/or in a substrate in corresponding regions of the substrate (referred to as active chip areas or active chip regions) utilizing various semiconductor processing technologies. An integrated circuit structure may include one or more (e.g. a plurality of) electrical circuit components, such among others may be transistors, resistors and/or capacitors, which are electrically connected and/or electrically interconnected and configured to perform operations, e.g. computing or storage operations, in the completely processed integrated circuit structure. In further semiconductor device fabrication a plurality of semiconductor devices may be singulated from the substrate after the semiconductor device processing by wafer-dicing to provide a plurality of singulated semiconductor devices (referred to as semiconductor chips) from the plurality of semiconductor devices of the substrate. Further, a final stage of semiconductor device fabrication may include packaging (also referred to as assembly, encapsulation, or seal) of singulated semiconductor devices, wherein a singulated semiconductor device may be encased, e.g. into a supporting material (also referred to as molding material or encapsulation material) to prevent physical damage and/or corrosion of the semiconductor device. The supporting material that encases the semiconductor device (and forms a referred to as package or mold) and may also support the electrical contacts and/or a lead frame to connect the semiconductor device to a peripheral device, e.g. to a circuit board.

According to various embodiments, during semiconductor device fabrication, various material types may be processed to form an integrated circuit structure, electrical circuit components, contacts and/or electrical interconnections, such among other may be electrically insulating materials, electrically semiconducting materials (also referred to as semiconductor material) or electrically conductive materials.

According to various embodiments, a substrate (also referred to as carrier or wafer) may include or be formed from at least one semiconductor material of various types, including a group IV semiconductor (e.g. silicon or germanium), a group III-V semiconductor (e.g. gallium arsenide), or other semiconductor types, including group III semiconductors, group V semiconductors or polymers, for example. In various embodiments, the substrate is made of silicon (doped or undoped), in alternative embodiments, the substrate is a silicon (Si) on insulator (SOI) wafer. As an alternative, any other suitable semiconductor material can be used for the substrate, for example semiconductor compound material such as gallium phosphide (GaP), indium phosphide (InP), but also any suitable ternary semiconductor compound material or quaternary semiconductor compound material such as indium gallium arsenide (InGaAs).

According to various embodiments, an electrically conductive material may include a metallic material (e.g. a metal or a metal alloy (e.g. an intermetallic compound)), a silicide (e.g. titanium silicide, molybdenum silicide, tantalum silicide or tungsten silicide), a conductive polymer, a polycrystalline semiconductor (e.g. polycrystalline silicon (also referred to as polysilicon)), or a highly doped semiconductor (e.g. highly doped silicon). An electrically conductive material may be understood as material with moderate electrical conductivity, e.g. with an electrical conductivity (measured at room temperature and constant electric field direction) larger than about 10 S/m, e.g. larger than about $10^2$ S/m, or with high electrical conductivity, e.g. larger than about $10^4$ S/m, e.g. larger than about $10^6$ S/m.

According to various embodiments, a metal refers to a chemical element (e.g. a metalloid, a transition metal, a post-transition metal, an alkali metal or an alkaline earth metal), such as tungsten (W), aluminum (Al), copper (Cu), nickel (Ni), magnesium (Mg), chromium (Cr), iron (Fe), zinc (Zn), tin (Sn), gold (Au), silver (Ag), iridium (Ir), platinum (Pt), indium (In), cadmium (Cd), bismuth (Bi), vanadium (V) or titanium (Ti).

A metal alloy may include at least two a metals (e.g. two or more than two metals, e.g. in the case of an intermetallic compound) or at least one metal (e.g. one or more than one metal) and at least one other chemical element (e.g. a non-metal or a half metal). For example, a metal alloy may include or may be formed from at least one metal and at least one non-metal (e.g. carbon), e.g. in the case of steel. For example, a metal alloy may include or may be formed from more than one metal (e.g. two or more metals), e.g. various compositions of gold with aluminum, various compositions of copper with aluminum, various compositions of copper and zinc (e.g. "brass") or an various compositions of copper and tin (e.g. "bronze"), e.g. including various intermetallic compounds.

An intermetallic compound may be understood as a metal alloy with two or more metals, wherein the two or more metals may be arranged in an atomic order (e.g. a lattice structure) and/or a defined stoichiometry such as $Cu_xSn_y$, (e.g. $Cu_3Sn$, $Cu_6Sn_5$ and/or $Cu_3Sn_5$) in the case of an alloy including at least Cu and Sn. For example, the stoichiometry and/or the atomic order of the intermetallic compound may define a certain composition (also referred to as intermetallic phase) of the two or more metals in nanometer, micrometer or millimeter scale.

An electrically insulating material, e.g. a dielectric material, may be understood as material with poor electrical conductivity, e.g. with an electrical conductivity (measured at room temperature and constant electric field direction) smaller than about $10^{-2}$ S/m, e.g. smaller than about $10^{-5}$ S/m, e.g. smaller than about $10^{-7}$ S/m. For example, an electrically insulating material may include a polymer, a resin, an adhesive, or a resist.

An electrically insulating material may further include a semiconductor oxide, a metal oxide, a ceramic, a semiconductor nitride, a metal nitride, a semiconductor carbide, a metal carbide, a glass, e.g. fluorosilicate glass (FSG), a dielectric polymer, e.g. benzocyclobutene (BCB) or polyimide (PI), a silicate, e.g. hafnium silicate or zirconium silicate, a transition metal oxide, e.g. hafnium dioxide or zirconium dioxide, an oxynitride, e.g. silicon oxynitride, or any other dielectric material types.

An electrically conductive layer may be understood to include or be formed from an electrically conductive material. An electrically insulating layer may be understood to include or be formed from an electrically insulating material. A metal layer may be understood to include or be formed from a metal.

Illustratively, a layer stack layout is provided which improves the compatibility with solder material including a higher tin concentration, e.g. such as lead-free solder material. The layer stack includes a metallization layer which provides a solderable surface and an adhesion layer which increases resistance against delamination of the layer stack, e.g. if the tin of the solder material penetrates the layer stack and changes its chemical and physical properties, in other words during soldering of the metallization layer.

Illustratively, a layer stack layout is provided which facilitates adaptation to conventional processing routines without compromising the fabrication of other regions of the device, e.g. other contact pads, and which minimizes the adaptation effort. In other words, a modification of conventional processing routines is provided which improves the compatibility to solder material with higher tin concentration.

FIG. 1A shows a semiconductor device 100a according to various embodiments in a cross-sectional view.

According to various embodiments, the semiconductor device 100a (e.g. a chip) may include at least one first contact pad 104 on a front side 100f of the semiconductor device 100a. Further, the semiconductor device 100a may include at least one second contact pad 114 on the front side 100f (first side) of the semiconductor device 100a. The at least one first contact pad 104 may be arranged laterally next to the at least one second contact pad 114. The at least one first contact pad 104 and the at least one second contact pad 114 may be formed over a surface 106f, e.g. a semiconductor surface.

According to various embodiments, the semiconductor device 100a may include a layer stack 102 disposed at least partially (e.g. partially or completely) over the at least one first contact pad 104, wherein the at least one second contact pad 114 is at least partially free of the layer stack 102. According to various embodiments, the layer stack 102 may be a metal layer stack 102. In other words, each layer of the layer stack 102 may include or may be formed from at least one of: a metal, a metal alloy.

According to various embodiments, the layer stack 102 may include at least an adhesion layer 102a and a metallization layer 102m. The metallization layer 102m may include a metal alloy (also referred as to metallization alloy) and the adhesion layer 102a may be disposed between the metallization layer 102m and the at least one first contact pad 104 for adhering the metal alloy (metallization alloy) of the metallization layer 102m to the at least one first contact pad 104.

The adhesion layer 102a has a thickness of less than or equal to about 0.5 µm, e.g. of less than or equal to about 0.4 µm, e.g. of less than or equal to about 0.3 µm (300 nm), e.g. of less than or equal to about 0.2 µm (200 nm), e.g. of less than or equal to about 0.1 µm (100 nm), e.g. in the range of about 0.1 µm to about 0.3 µm.

Figure 1B:
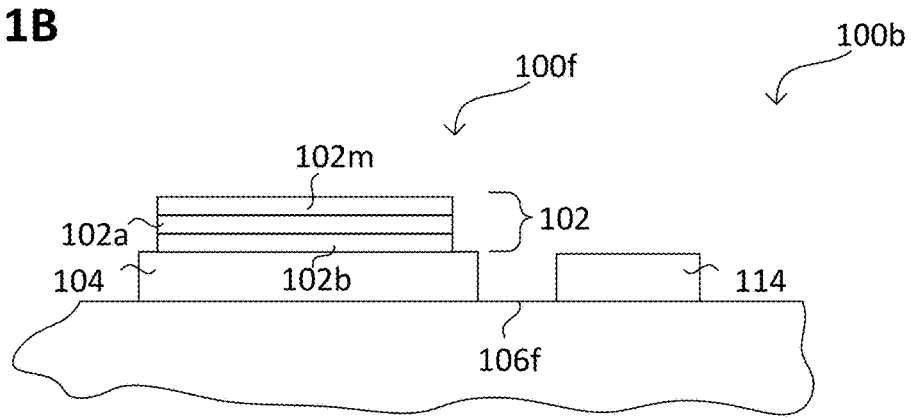

FIG. 1B shows a semiconductor device 100b according to various embodiments in a cross-sectional view.

According to various embodiments, the semiconductor device 100b (e.g. a chip) may include at least one first contact pad 104 on a front side 100f of the semiconductor device 100b. Further, the semiconductor device 100b may include at least one second contact pad 114 on the front side 100f (first side) of the semiconductor device 100b. The at least one first contact pad 104 and the at least one second contact pad 114 may be formed over a surface 106f, e.g. a semiconductor surface.

The semiconductor device 100b may include a layer stack 102 disposed at least partially (e.g. partially or completely) over the at least one first contact pad 104, wherein the at least one second contact pad 114 is at least partially free of the layer stack 102. The layer stack 102 may be a metal layer stack 102. In other words, each layer of the layer stack 102 may include at least one of: a metal, a metal alloy.

The layer stack 102 may include at least a barrier layer 102b, an adhesion layer 102a and a metallization layer 102m. The metallization layer 102m may include a metal alloy, wherein the adhesion layer 102a may be disposed between the metallization layer 102m and the barrier layer 102b for adhering the metal alloy (metallization metal alloy) of the metallization layer 102m to the barrier layer 102b.

According to various embodiments, the barrier layer 102b has a thickness of less than or equal to about 0.5 µm, e.g. of less than or equal to about 0.4 µm, e.g. of less than or equal to about 0.3 µm (300 nm), e.g. of less than or equal to about 0.2 µm (200 nm), e.g. of less than or equal to about 0.1 µm (100 nm), e.g. in the range of about 0.1 µm to about 0.3 µm.

Illustratively, the barrier layer 102b may provide a stable (e.g. chemical stable and/or mechanical stable) configuration of the semiconductor device 100b. For example, the barrier layer 102b may avoid migration (e.g. interdiffusion) of atoms through the barrier layer 102b, e.g. during soldering. Optionally, the barrier layer 102b may provide a mechanical stable configuration by separating the metallization layer 102m from the at least one first contact pad 104 which avoids the formation of brittle interfaces (for example, an Al/Cu interface is brittle). Optionally, the barrier layer 102b may provide chemical stable configuration of the at least one second contact pad 114, e.g. during etching.

Illustratively, the metallization layer 102m may provide a solderable surface for contacting the semiconductor device 102, e.g. using soldering (e.g. in a contacting step). Optionally, a thin organic layer may be formed on the metallization layer 102m.

Illustratively, the adhesion layer 102a may provide a mechanical stable configuration of the semiconductor device 100b, e.g. during soldering. For example, the adhesion layer 102a may provide a stable and full contact of the metallization layer 102m over the at least one first contact pad 104. In other words, the introduction of the adhesion layer 102a may avoid dewetting of the metallization layer 102m (in other words, the adhesion layer 102a may adhere the metallization layer 102m), which may appear, if the metallization alloy contacts the barrier layer 102b and or the at least one first contact pad 104. This may provide a stable metallization layer 102m interface. For example, the metallization layer 102m and the adhesion layer 102a may partially chemically interconnect, e.g. a metal (e.g. the third metal, e.g. Ti) of the adhesion layer 102a and a metal (e.g. the first metal, e.g. Sn) of the metallization layer 102m may form a metal alloy, e.g. an intermetallic compound (e.g. TiSn), e.g. forming an intermetallic interface. Alternatively, an interface including the metal alloy of the metallization layer 102m and a metal (e.g. the third metal, e.g. Ti) of the adhesion layer 102a may be formed which provides adhesion.

According to various embodiments, at least the at least one first contact pad 104 and/or at least the at least one second contact pad 114 may be part of a front side metallization of the semiconductor device 100b (also referred to as chip front side metallization). The front side metallization may include or may be formed from one or more layers (forming a metal layer system), e.g. at least a first metallization (e.g. in contact with the surface 106f) and at least a final metallization (e.g. the metallization layer 102m, e.g. including or formed from Cu). The first metallization (also referred to as base metallization) may be a part of or may form a contact pad (e.g. the at least one first contact pad 104 and/or the at least one second contact pad 114), e.g. including or formed from AlCu or AlSiCu.

According to various embodiments, a solderable front side metallization (e.g. including at least the at least one first contact pad 104 and the layer stack 102) is provided for the usage of lead-free solder material (or a lead-free solder joint). For example, a lead-free solder material (e.g. lead-free solder paste) may include a high concentration of tin (Sn), e.g. greater than about 20 atomic percent (at. %), e.g. greater than about 50 at. %. A lead-free solder material tends to show significant weaknesses in usage with contact pads (e.g. with a metal stack without the adhesion layer 102a). The usage of the adhesion layer 102a may provide an economical and reliable modification of conventional metal stacks, e.g. in order to transform a lead containing solder processing technology into a lead-free solder processing technology. The usage of the adhesion layer 102a may further provide the adaption of conventional semiconductor processing to lead-free solder processing, e.g. without remarkable changes. According to various embodiments, a conversion of processing technologies using high melting temperature type solders (with a melting temperature greater than about 250° C.) to lead-free solder materials is provided.

According to various embodiments, a modification of a metal layer system (including at least a contact pad and the layer stack 102) may be provided. For example, an AlCu/TiW/Cu (in other words, an AlCu contact pad, a TiW barrier layer 102b, and a Cu metallization layer 102m) system may be modified into an AlCu/TiW/Ti/Cu system. For example, an AlCu/Cu stack (in other words, an AlCu contact pad, and a Cu metallization layer 102m) may be modified into an AlCu/Ti/Cu stack. The modified stack may facilitate the usage of lead-free solder material.

According to various embodiments, certain chip regions (e.g. including a contact pad) of a semiconductor device may be provided with or without a solderable front side metallization.

According to various embodiments, a solderable front side metallization may be provided which satisfies various aspects, as among others may be: electrical contact (e.g. illustratively providing maximum electrical conductance of the electrical contact), mechanical contact (e.g. illustratively providing mechanical stability), solderability (e.g. illustratively providing good suitability of the semiconductor device for the industrial soldering), device specific requirements (e.g. limits of leakage currents, e.g. providing a semiconductor device which is substantially free of leakage currents), compatibility with device specific layouts (e.g. passivation and/or metallization, providing a non-corrosive front side metallization, adhesion to mold materials, bondable (e.g. for Cu, Al or Au bonding wires), economic processing, broad process tolerances (e.g. illustratively suitable for high process throughput), and compatibility to lead containing solder material as well as to lead-free solder material.

According to various embodiments, existing semiconducting technology equipment and semiconducting technology methods may be used for forming the layer stack 102, e.g. in order to introduce lead-free solder material. In other words, existing semiconducting technology equipment and semiconducting technology methods may be adopted for lead-free processing. According to various embodiments, quality losses due to introduction of lead-free solder materials (or lead-free semiconductor devices) compared to conventional semiconductor device may be avoided. According to various embodiments, increase of process costs may be smaller compared to hypothetical alternatives, e.g. in order to introduce lead-free solder material, e.g. in lead-free solder processing technology. According to various embodiments, an easy processible, versatile, cost-effective and high quality front side metallization may be provided (compared to hypothetical alternatives), e.g. in order for the usage of lead-free solder material.

According to various embodiments, controllability of the above mentioned aspects may be provided, e.g. the controllability and/or stability of the metal layer system may be increased by reducing the amount of soldering components (e.g. to just Cu, Ti and Sn). According to various embodiments, the production costs may be reduced with facilitating the process control and/or with facilitating the formation of a stable metal layer system, e.g. in high vacuum.

According to various embodiments, the following aspects may be addressed: a metallization layer 102m as soldering component (e.g. including or formed from Cu) may be provided as being compatible to lead containing solder material and lead-free solder material. However, a greater metallization layer 102m thickness (e.g. Cu-layer thickness) may lead to a higher risk of forming voids (e.g. micro voids) in the region of intermetallic phases. In the case that the metallization layer 102m is thin (e.g. thinner than 10 μm) and a barrier layer 102b may be used (e.g. as a solder stop layer), at least one of the following may be avoided using the adhesion layer 102a: a drip off (also referred to as dewetting) of intermetallic phases, formation of corrosive phases, formation of brittle phases. Further, a chemical structuring with a sensitive stop (e.g. a solder stop) may be provided on or over the first metallization (at least including the at least one first contact pad 104 and/or at least including the at least one second contact pad 114) which sustains stable during semiconductor processing, e.g. during soldering-steps, e.g. during a contacting-step as described in the following. The metallization layer 102m may be adjusted to certain aspects, e.g. mentioned above (e.g. the metallization layer 102m may include at least Cu and/or Al), or certain other requirements (e.g. customization), for interconnecting the semiconductor device 100b. For example, a Cu-metallization layer 102m may be provided in case of a solder joint (e.g. over the at least one first contact pad 104), an Al-metallization layer 102m may be provided in case of a Al wedge connection (e.g. over the at least one second contact pad 114), or one of both (a Cu-metallization layer 102m or a Al-metallization layer 102m), may be provided (e.g. over the at least one second contact pad 114) in case of a bond connection (e.g. a nailhead wire bond connection). Further, a front side metallization (e.g. at least the layer stack 102) may be provided which is free of Cu, e.g. in case of a risk of deterioration of the semiconductor device due to Cu migration. The mentioned aspects may be addressed by a metal layer system described herein, e.g. a Al(Si)Cu/TiW/Ti/Cu layer system (at least including a Al(Si)Cu contact pad, a TiW barrier layer 102b, a Ti adhesion layer 102a and a Cu metallization layer 102m).

The layout of a front side metallization (e.g. the layer stack 102) may be revealed by EDX (energy dispersive X-ray spectroscopy) analysis (e.g. for determination of at least the TiW materials and/or Cu materials), e.g. EDX line scan, and/or SEM (scanning electron microscope) analysis, e.g. scanning the barrier layer/metallization layer (e.g. TiW/Cu) interface and/or scanning the underetched barrier layer 102b under the metallization layer 102m (which indicates a wet etching process).

A front side metallization may be provided which is stable during further process steps, e.g. thinning the substrate, forming further layers of the semiconductor device 100b, packaging the semiconductor device 100b (e.g. embedding the semiconductor device 100b into mold material). The package may have a size in the range of about 9 mm$^2$, e.g. about 3 mm width and about 3 mm length.

Figure 1C:
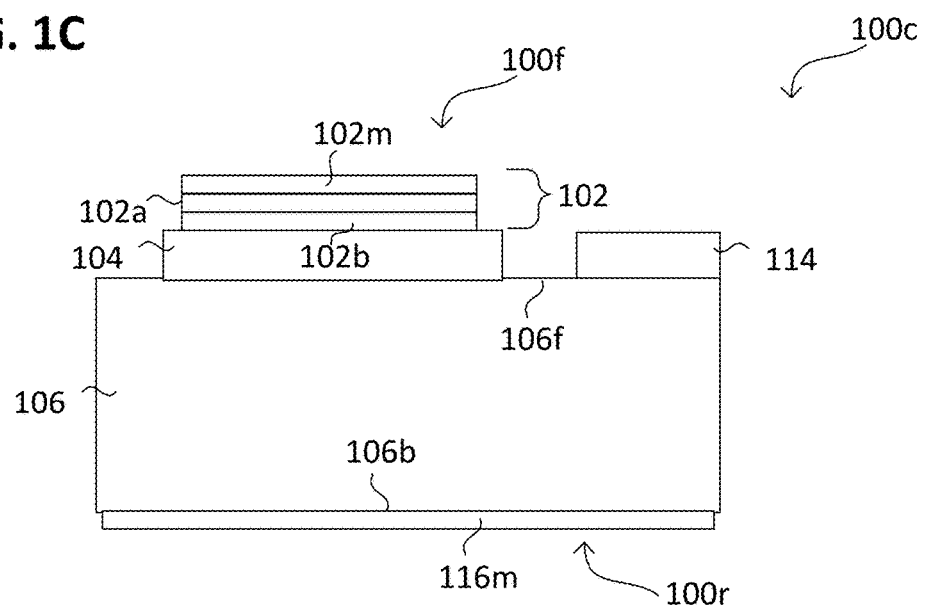

FIG. 1C shows a semiconductor device 100c according to various embodiments in a cross-sectional view or a schematic side view in a method according to various embodiments.

The semiconductor device 100c may include a device body 106, wherein the surface 106f (front surface) may be the surface of the device body 106. The device body 106 may be part or may be a substrate.

The device body 106 may include a semiconductor material (e.g. as part of a substrate, e.g. a semiconductor substrate). The semiconductor device 100c may include a front side 100f and a rear side 100r (second side) opposite the front side 101a. The device body 106 may include a front surface 106f (first surface) on the front side 100f and a rear surface 106b (second surface) on the rear side 100r.

According to various embodiments, the front surface 106f may be a main processing surface of the semiconductor device 100c. The device body 106 may have a thickness (e.g. perpendicular to the front surface 106f and/or to the second surface 106b) in the range from about 100 μm to about 5 mm, e.g. in the range from about 100 μm to about 1 mm, e.g. in the range from about 300 μm to about 800 μm. The device body 106 may include or be formed from a semiconductor material.

The semiconductor device 100c may include at least one rear metallization layer 116m (e.g. one or more metallization layer 116m) on the rear side 100r (also referred to as back side) of the semiconductor device 100c. The rear side 100r may be opposite to the front side 100f. The rear metallization layer 116m may be electrically conductive (also referred to as electrically conducting). In other words, the rear metallization layer 116m may include or be formed from an electrically conductive material, e.g. the rear metallization layer 116m may include or may be formed from a metal and/or a metal alloy. For example, the rear metallization layer 116m may include at least Al and/or Cu.

According to various embodiments, the rear metallization layer 116m may be part of a rear contact pad (not shown), e.g. the metallization layer 116m may be processed further to form a rear contact pad.

According to various embodiments, the barrier layer 102b, the adhesion layer 102a and/or the metallization layer 102m may be electrically conductive (in other words, they may include or be formed from an electrically conductive material). At least two (e.g. pairwise) of the barrier layer 102b, the adhesion layer 102a and the metallization layer 102m may be formed from a different material, e.g. with a different composition, from a different metal and/or different metal alloy, e.g. with different stoichiometry.

The at least one first contact pad 104 may include one or more than one first contact pads, e.g. two first contact pads, e.g. three first contact pads, e.g. four first contact pads, e.g. five first contact pads, e.g. more than five first contact pads, e.g. more than ten first contact pads, e.g. more than twenty first contact pads, etc. The at least one second contact pad 114 may include one or more than one second contact pad, e.g. two second contact pads, e.g. three second contact pads, e.g. four second contact pads, e.g. five second contact pads, e.g. more than five second contact pads, e.g. more than ten second contact pads, e.g. more than twenty second contact pads, etc.

According to various embodiments, the rear metallization layer 116m may be stable (mechanically stable and/or chemically stable) regarding singulating the device body 106, e.g. from a wafer (e.g. if the rear metallization layer 116m may be formed directly before singulating the device body 106). In this case, the rear metallization layer 116m may be formed in physical contact to the device body 102, e.g. in physical contact to the substrate, e.g. in physical contact to semiconductor material.

FIG. 2 shows a method 200 according to various embodiments, in a schematic flow diagram.

The method 200 may include in 201 forming at least one first contact pad on a front side of the semiconductor device and at least one second contact pad on the front side of the semiconductor device. Further, the method 200 may include in 203 forming a layer stack at least partially over the at least one first contact pad, such that the at least one second contact pad is free of the layer stack.

The layer stack may be configured similar or equally to the layer stack 102, see FIG. 1A. In this case, the layer stack may be formed such, that the layer stack includes at least an adhesion layer and a metallization layer. The metallization layer may include a metal alloy (metallization alloy) and the adhesion layer is disposed between the metallization layer and the at least one first contact pad for adhering the metal alloy (metallization alloy) of the metallization layer to the at least one first contact pad.

In this case, forming the layer stack may include forming at least the adhesion layer and the metallization layer. Forming the layer stack may further include forming the metallization layer over the adhesion layer and/or forming the adhesion layer over the at least one first contact pad.

Alternatively, the layer stack may be configured similar or equally to the layer stack 102, see FIG. 1B. According to various embodiments, the layer stack may be formed such, that the layer stack includes at least a barrier layer, an adhesion layer and a metallization layer. The metallization layer may include a metal alloy and the adhesion layer is disposed between the metallization layer and the barrier layer for adhering the metal alloy of the metallization layer to the barrier layer.

In this case, forming the layer stack may include forming at least the barrier layer, the adhesion layer and the metallization layer. Forming the layer stack may include forming the metallization layer over the adhesion layer and/or forming the adhesion layer over the barrier layer and/or forming the barrier layer at least partially (e.g. partially or completely) over the at least one first contact pad.

According to various embodiments, forming the layer stack may optionally include structuring at least one of the barrier layer, the adhesion layer and the metallization layer. For example, structuring at least one of the barrier layer, the adhesion layer and the metallization layer may include partially removing material of structuring at least one of the barrier layer, the adhesion layer and the metallization layer to separate structuring at least one of the barrier layer, the adhesion layer and the metallization layer. For example, at least one of the barrier layer, the adhesion layer and the metallization layer may be structured (also referred to as patterned) by partially removing at least one of the barrier layer, the adhesion layer and the metallization layer. For example, structuring at least one of the barrier layer, the adhesion layer and the metallization layer may include exposing a surface, a region or an element of the semiconductor device at least partially, e.g. the first surface, the at least one second contact pad or another layer of the semiconductor device.

The method 200 may be further configured, as described herein.

The method may provide compatibility to device specific layouts, e.g. compatibility to Al-surfaces (e.g. a surface of the at least one second contact pad 114). In other words, a damage to Al-surfaces may be avoided using the method.

Figure 3A:
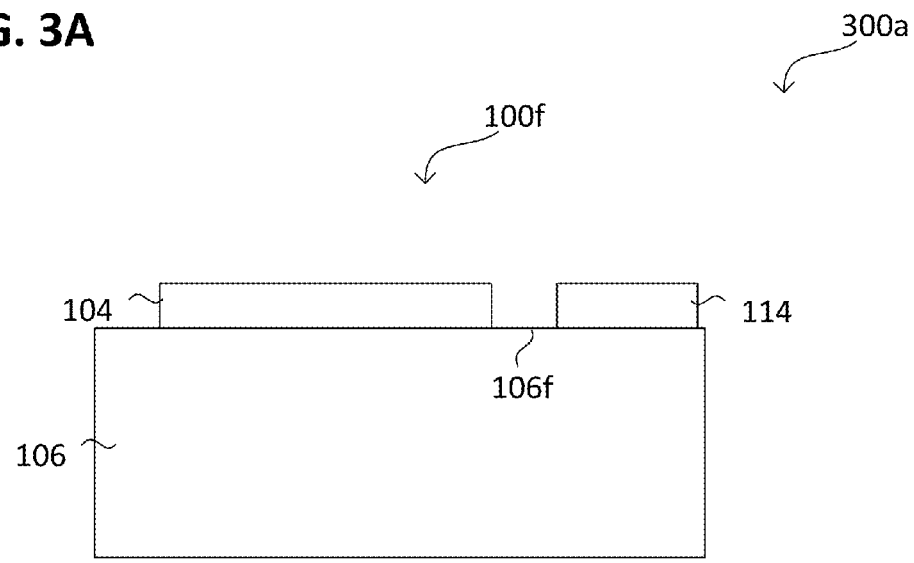
FIG. 3A and FIG. 3B respectively show a semiconductor device according to various embodiments in a cross-sectional view or a schematic side view in a method according to various embodiments.

FIG. 3A shows a semiconductor device 300a according to various embodiments in a cross-sectional view or a schematic side view in a method according to various embodiments (e.g. in a first step of the method). At least one first contact pad 104 and at least one second contact pad may be formed on the front side 100f of the semiconductor device 300a.

Figure 3B:
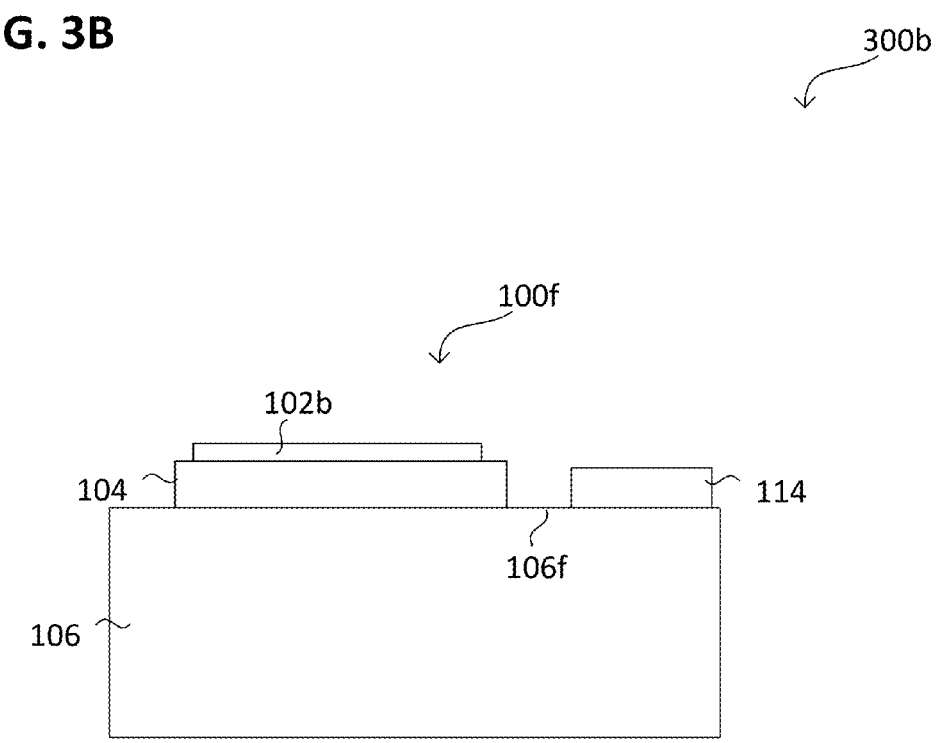

FIG. 3B shows a semiconductor device 300b according to various embodiments in a cross-sectional view or a schematic side view in a method according to various embodiments (e.g. in an optional second step of the method). At least one barrier layer 102b may be formed on the front side 100f of the semiconductor device 300b. The barrier layer 102b may be formed at least partially over the at least one first contact pad 104. For example, the barrier layer 102b may be formed in physical contact with the at least one first contact pad 104. Alternatively, other layers may be formed between the barrier the layer 102b and the at least one first contact pad 104 if necessary.

Figure 4A:
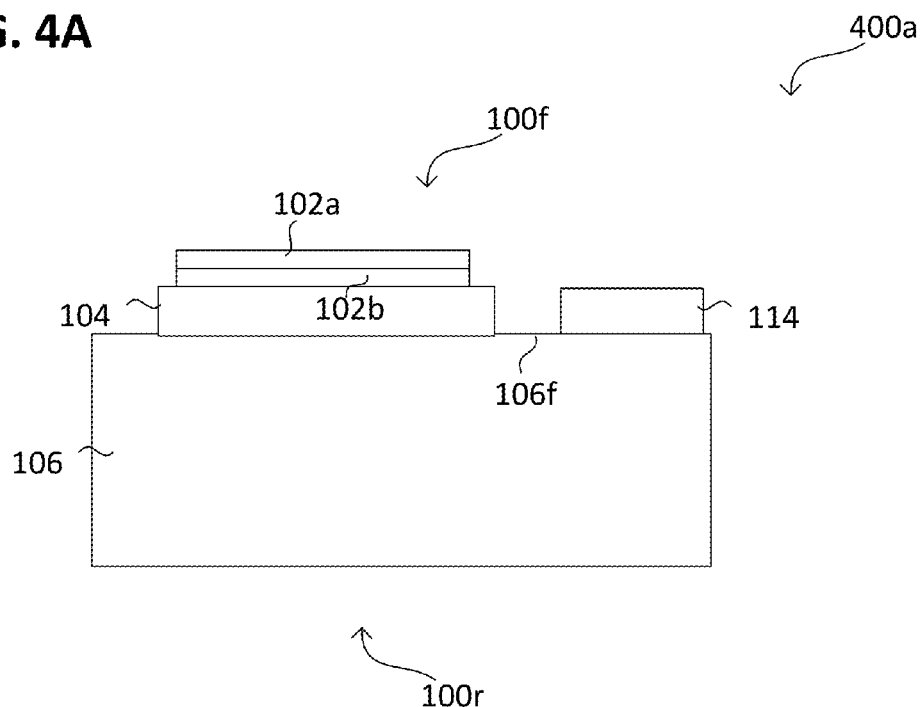
FIG. 4A and FIG. 4B respectively show a semiconductor device according to various embodiments in a cross-sectional view or a schematic side view in a method according to various embodiments.

FIG. 4A shows a semiconductor device 400a according to various embodiments in a cross-sectional view or a schematic side view in a method according to various embodiments (e.g. in a third step of the method). At least one adhesion layer 102a may be formed on the front side 100f of the semiconductor device 400a. The adhesion layer 102a may be formed at least partially over the at least one first contact pad 104. For example, the adhesion layer 102a may be formed in physical contact with the barrier layer 102b. Alternatively, other layers may be formed between the adhesion layer 102a and the barrier layer 102b if necessary.

At least one metallization layer 102m may be formed on the front side 100f of the semiconductor device 400a (see FIG. 1A or FIG. 1B), in an further step of the method (e.g. in a fourth step of the method) to obtain the layer stack 102. The metallization layer 102m may be formed at least partially over the at least one first contact pad 104. For example, the metallization layer 102m may be formed in physical contact with the adhesion layer 102a. Alternatively, other layers may be formed between the metallization layer 102m and the adhesion layer 102a if necessary.

In a step of the method (e.g. in the fourth step of the method), the metallization layer 102m may be formed using a metal alloy (in other words, from the metallization alloy), e.g. by disposing the metallization alloy on the front side 100f of the semiconductor device 400a. The metallization alloy may include at least two metals, e.g. at least a first metal (e.g. Sn) and at least a second metal (e.g. Cu). The metallization alloy may be disposed on the front side 100f of the semiconductor device 400a, with a defined composition, e.g. stoichiometric.

Alternatively, at least the second metal may be disposed on the front side 100f of the semiconductor device 400a (see FIG. 1A or FIG. 1B), in a step of the method (e.g. in the fourth step of the method). The second metal may be part of the metallization layer 102m. For example, the second metal may be disposed in form of or may be part of a layer (second metal layer). The second metal may be disposed at least partially over the at least one first contact pad 104. For example, the second metal may be disposed in physical contact with the adhesion layer 102a. Alternatively, other layers may be formed between the second metal and the adhesion layer 102a if necessary.

In this case, at least the first metal may be disposed on the front side 100f of the semiconductor device 400a (see FIG. 1A or FIG. 1B), in a further step of the method (e.g. in a fifth step of the method, also referred to as alloying-step). For example, the first metal may be part of a solder material and optionally may be disposed in form of a layer (first metal layer), e.g. a solder layer. The first metal may be disposed at least partially over the at least one first contact pad 104. For example, the first metal may be disposed in physical contact with the second metal (e.g. on the second metal). Alternatively, other layers may be formed between the first metal and the second metal if necessary.

In this case, at least the first metal and at least the second metal may be used to form the metallization alloy (e.g. a CuSn alloy) of the metallization layer 102m, e.g. at least at the interface between the first metal (e.g. the first metal layer) and the second metal (e.g. the second metal layer) and/or at least at the interface of the adhesion layer 102a and the metallization layer 102m. For example, at least the first metal and at least the second may interfuse each other (e.g. by mixing) at least partially, e.g. by diffusing into each other (interdiffusion), to form the metallization alloy at least at the interface. For example, at least the first metal and at least the second metal may form at least one intermetallic compound, e.g. $Cu_xSn_y$, (e.g. $Cu_3Sn$, $Cu_6Sn$ and/or $Cu_3Sn_5$). During further processing the metallization alloy of the metallization layer 102m may extend substantially through the second metal (e.g. the second metal layer), e.g. substantially through the metallization layer 102m, e.g. at least in a vertical direction. In other words, the metallization layer 102m may include the metal alloy at the interface of the of the adhesion layer 102a and the metallization layer 102m.

At least the first metal and at least the second metal may alloy with each other at least partially to form the metallization alloy (e.g. a metal alloy layer), e.g. at least at the interface of the first metal and the second metal. For example, at least the first metal and at least the second metal may react with each other (chemical reaction). To form the metallization alloy, at least the first metal and at least the second metal may be heated, e.g. to a temperature greater than about 150° C., e.g. greater than about 200° C., e.g. greater than about 220° C., e.g. greater than about 240° C., e.g. greater than about 260° C., e.g. greater than about 280° C., e.g. greater than about 300° C., e.g. greater than about 350° C., e.g. greater than about 400° C., e.g. to a temperature in the range about 200° C. to about 450° C., e.g. to a temperature in the range about 230° C. to about 350° C.

The metallization alloy (e.g. metal alloy layer) may form the metallization layer 102m at least partially. In other words, the metallization layer 102m may include or may be formed from the metallization alloy (e.g. metal alloy layer). The metallization alloy (e.g. metal alloy layer) may include at least two metals, e.g. at least a first metal (e.g. Sn) and at least a second metal (e.g. Cu).

According to various embodiments, forming the metallization alloy may include consuming the first metal at least partially (e.g. partially or completely) and/or the second metal at least partially (e.g. partially or completely). For example, the second metal may be consumed substantially completely and the first metal may be consumed partially. In this case, the first metal (e.g. regions including the first metal) may partially remain next to, e.g. vertically (e.g. over), the metallization alloy (e.g. the metal alloy layer). Since the first metal is consumed partially to form the metallization alloy, the metallization layer 102m may include the first metal, e.g. as part of the metallization alloy. At least 50% of the second metal, e.g. substantially 100% of the second metal may be consumed, e.g. 5 μm of the second metal layer, e.g. 10 μm of the second metal layer.

A concentration of the first metal in the metallization layer 102m, e.g. in the metallization alloy, may be smaller than or equal to about 80 at. %, e.g. smaller than or equal to about 70 at. %, e.g. smaller than or equal to about 60 at. %, e.g. smaller than or equal to about 50 at. %, e.g. smaller than or equal to about 40 at. %, e.g. smaller than or equal to about 30 at. %, e.g. smaller than or equal to about 25 at. %, e.g. smaller than or equal to about 20 at. %, e.g. smaller than or equal to about 15 at. %, e.g. smaller than or equal to about 10 at. %, e.g. in the range from about 10% to about 65%.

A ratio (atomic ratio) of the first metal to the second metal (e.g. a ratio of the concentration of the first metal to the concentration of the second metal) in the metallization layer 102m, e.g. at least in the metallization alloy, may in the range from about 0.1 to about 0.9, e.g. in the range from about 0.15 to about 0.6.

A concentration of the second metal in the metallization layer 102m, e.g. in the metallization alloy, may be greater than or equal to about 10 at. %, e.g. greater than or equal to about 20 at. %, e.g. greater than or equal to about 30 at. %, e.g. greater than or equal to about 40 at. %, e.g. greater than or equal to about 50 at. %, e.g. greater than or equal to about 60 at. %, e.g. greater than or equal to about 75 at. %, e.g. greater than or equal to about 80 at. %, e.g. greater than or equal to about 85 at. %, e.g. greater than or equal to about 90 at. %, e.g. in the range from about 35% to about 90%.

The metallization layer 102m (e.g. the second metal layer) has a thickness (in a vertical direction) of less than or equal to about 5 μm, of less than or equal to about 4 μm, e.g. of less than or equal to about 3 μm, e.g. of less than or equal to about 2 μm, e.g. of less than or equal to about 1 μm, e.g. in the range from about 0.5 μm to about 4 μm, e.g. in the range from about 1.5 μm to about 3 μm, or in the range from about 1 μm to about 2 μm. A thinner metallization layer 102m may increase a risk of losing full contact (also referred to as dewetting) to the adhesion layer 102a. A thicker metallization layer 102m increase mechanical load to the semiconductor device 400a, e.g. due to a thermal expansion mismatch. For example, a thicker metallization layer 102m may bend the semiconductor device 400a. Further, a thicker metallization layer 102m may increase production costs.

Figure 5A:
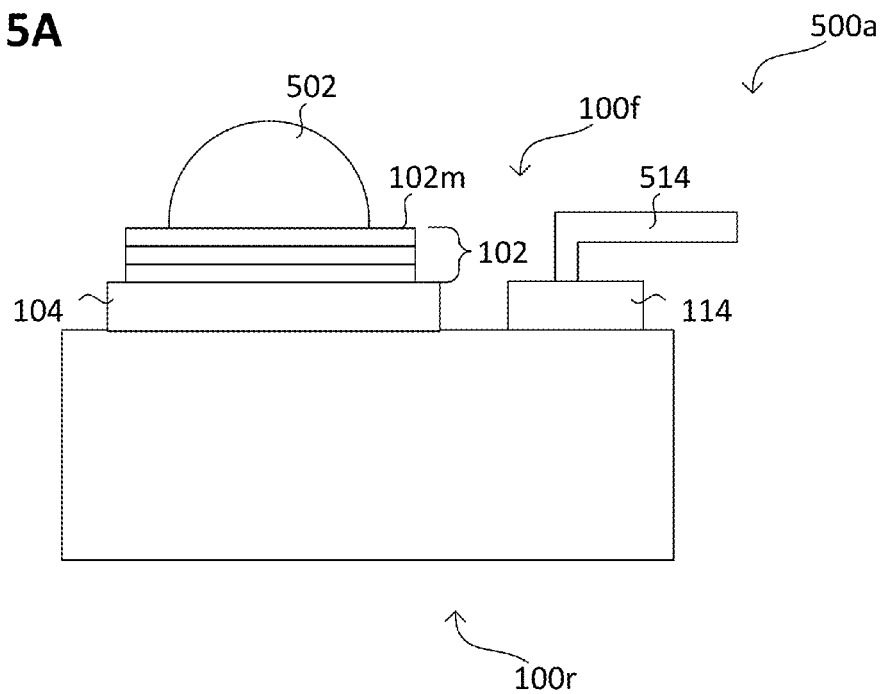
FIG. 5A and FIG. 5B respectively show a semiconductor device according to various embodiments in a cross-sectional view or a schematic side view in a method according to various embodiments.
Figure 5B:
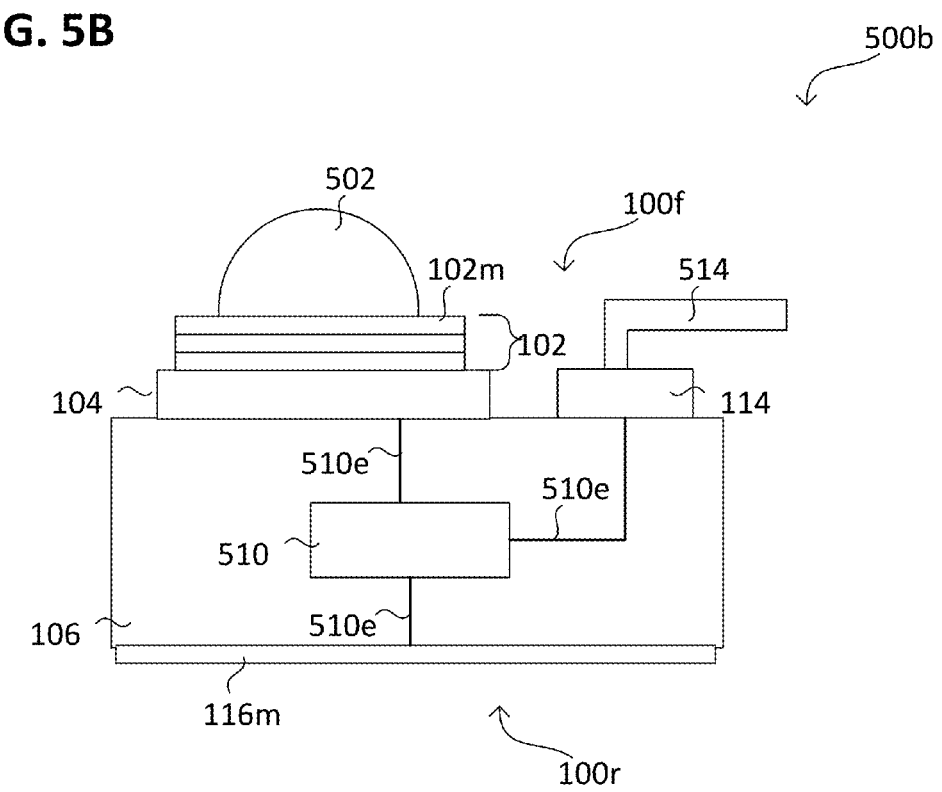

Optionally, the at least one rear metallization layer 116m may be formed on the rear side 100r of the semiconductor device 400a (not shown, see FIG. 1C or FIG. 5B).

Figure 4B:
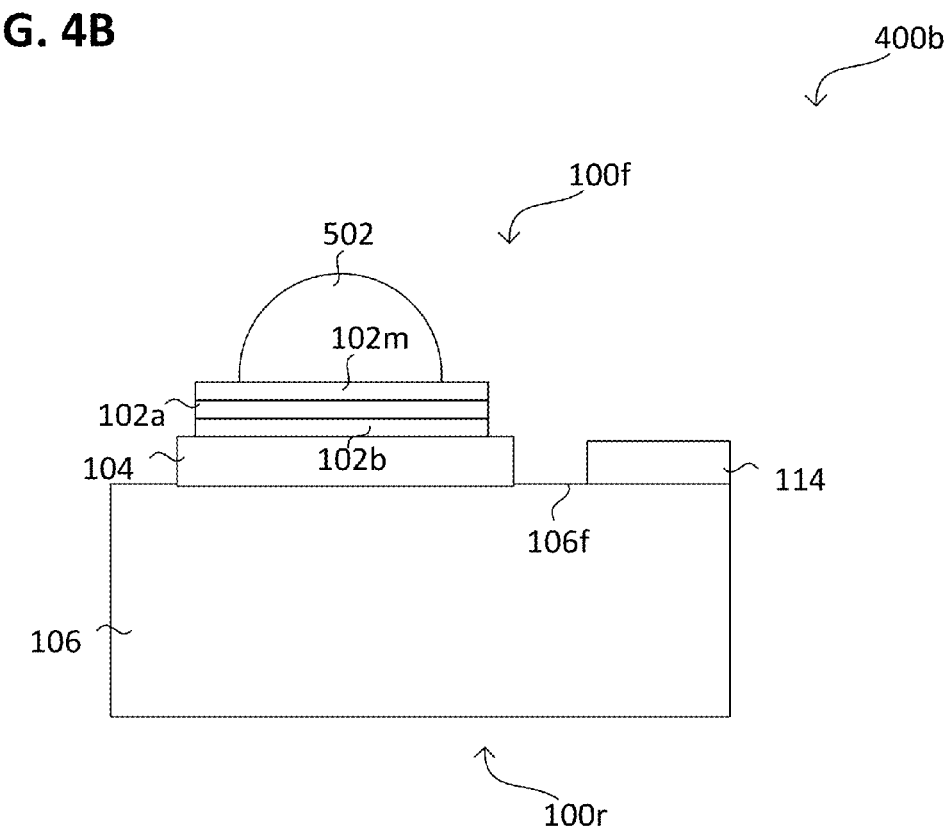

FIG. 4B shows a semiconductor device 400a according to various embodiments in a cross-sectional view or a schematic side view in a method according to various embodiments (in a contacting-step, e.g. in a fourth and/or a fifth step of the method).

The layer stack 102 may illustratively be configured to be contacted by soldering, e.g. using a solder joint 502, e.g. for a high current operation such as operating the source/drain of a FET. A method according to various embodiments (e.g. the method 200) may optionally include electrically contacting the layer stack 102 (and also the at least one first contact pad 104) by a soldering, e.g. in contacting-step.

As shown in FIG. 4B, a method according to various embodiments (e.g. the method 200) may optionally include forming at least one solder joint 502 on the layer stack 102, e.g. on the metallization layer 102m, e.g. in direct physical contact with the metallization layer 102m. The at least one solder joint 502 may include or be formed from a solder material, e.g. including the first metal (e.g. Sn) or a metallization alloy including the first metal and another chemical element (e.g. a half metal, such as Sb), e.g. a SnSb alloy, to adjust its melting temperature. The solder material may include other metals to adjust its melting temperature, e.g. Al, Cu, Ag, Zn, etc. The melting temperature of the solder joint 502 may be defined by the melting temperature of the solder material, e.g. may be identical. The melting temperature (also referred to as melting point) of the solder material may be greater than about 220° C., e.g. greater than about 240° C., e.g. greater than about 260° C., e.g. greater than about 280° C., e.g. greater than about 300° C., e.g. greater than about 350° C., e.g. greater than about 400° C., e.g. in the range about 200° C. to about 450° C., e.g. in the range about 230° C. to about 350° C.

According to various embodiments, to form the metallization alloy, at least the first metal, e.g. the solder material, and/or at least the second metal may be heated to a temperature greater than the melting temperature of the solder material.

According to various embodiments, the solder joint 502 (e.g. the solder material) may be substantially free of lead (Pb), e.g. in the form of a referred to as lead-free solder joint 502 (e.g. a lead-free solder material). In other words, a concentration of Pb in the solder joint 502 (e.g. the solder material) may be less than or equal to about 10%, e.g. less than or equal to about 5%, e.g. less than or equal to about 2%, e.g. less than or equal to about 1%, e.g. less than or equal to about 0.1%.

A concentration of the first metal (e.g. Sn) in the solder joint is greater than or equal to about 20 at. %, e.g. greater than or equal to about 25 at. %, e.g. greater than or equal to about 30 at. %, e.g. greater than or equal to about 35 at. %, e.g. greater than or equal to about 40 at. %, e.g. greater than or equal to about 45 at. %, e.g. greater than or equal to about 50 at. %, e.g. in a range of about 20 at. % to about 100 at %, e.g. in a range of about 25 at. % to about 80 at %, e.g. in a range of about 30 at. % to about 60 at %.

According to various embodiments, forming the at least one solder joint 502 may include disposing the solder material, e.g. an in fluid form (in other words in melted form, e.g. with a temperature greater than the melting temperature of the solder material) or in form of a solder paste (with a temperature less than the melting temperature of the solder material) on the layer stack 102, e.g. on the metallization layer 102m.

The solder paste may include the solder material (also referred to as solder) in solid form (in other words, with a temperature less than the melting temperature of the solder material), e.g. in granular form (also referred to as powder form or particle form), and a solvent, e.g. a flux solvent. After disposing the solder paste, the solder paste may be heated to a temperature greater than the melting temperature of the solder material to melt the solder material.

After disposing the solder material, the solder material may be cooled down from a temperature greater than the melting temperature to a temperature less than the melting temperature in order to solidify the solder material. Optionally, before solidifying the solder material, a contact structure (e.g. a clip or a lead frame) may be contacted (e.g. in physical contact) with the solder material in fluid form to contact the layer stack 102 electrically, e.g. to form an electrical connection between the contact structure and the layer stack 102, and the at least one first contact pad 104 respectively.

The electrical connection between the contact structure and the layer stack 102, and the at least one first contact pad 104 respectively, may be able to carry an electrical current of at least about 100 A (peak current) without deterioration. The layer stack 102 may reduce the thermal resistance, e.g. for cooling the semiconductor device 400b.

The solder material may be disposed on the metallization layer 102m, wherein the metallization layer 102m (already) includes the metallization alloy. Alternatively or additionally, the solder material may be disposed on the metallization layer 102m, wherein the metallization layer 102m (is free of the metallization alloy and) includes the second metal, e.g. in form of the second metal layer. In this case, the first metal of the solder material may interfuse with the second metal of the metallization layer 102m to form the metal alloy of the metallization layer 102m (also referred as to metallization alloy), e.g. at least at the interface of the metallization layer 102m and the adhesion layer 102a.

According to various embodiments, the solder material may form a solder layer (e.g. a solder joint), wherein the solder layer has a thickness (in a vertical direction) of greater than or equal to about 5 μm, of greater than or equal to about 10 μm, e.g. of greater than or equal to about 15 μm, e.g. of greater than or equal to about 20 μm, e.g. of greater than or equal to about 30 μm, e.g. in the range from about 10 μm to about 100 μm, e.g. in the range from about 30 μm to about 50 μm, e.g. about 40 μm.

Optionally, the at least one rear metallization layer 116m may be formed, on the rear side 100r of the semiconductor device 400b (not shown, see FIG. 1C or FIG. 5B).

FIG. 5A shows a semiconductor device 500a according to various embodiments in a cross-sectional view.

The at least one second contact pad 114 may illustratively be configured to be contacted by bonding, e.g. using a bonding wire, e.g. for a low current operation such as operating the gate of a FET. A method according to various embodiments (e.g. the method 200) may optionally include (e.g. in a contacting-step) electrically contacting the at least one second contact pad 114 by bonding, e.g. using a bonding wire 514. The bonding wire 514 may include or may be formed from a metal (e.g. Al, Co, Ag, Au, etc.), or a metal alloy including at least the metal.

FIG. 5B shows a semiconductor device according to various embodiments in a cross-sectional view.

As illustrated in FIG. 5B, a method according to various embodiments (e.g. the method 200) may optionally include forming an integrated circuit structure 510 in or on the semiconductor device 500a, e.g. in or on the device body, e.g. in or on the substrate. The integrated circuit structure 510 may include or may be formed from one or more (e.g. a plurality of) electrical circuit components, e.g. one or more transistors, resistors and/or capacitors. For example, the integrated circuit structure 510 may include or may be formed from a power a transistor. In this case, the semiconductor device 500a may be configured as a power semiconductor device.

According to various embodiments, the integrated circuit structure 510 of the semiconductor device 500a may be electrically connected 510e, e.g. by wires and/or metal lines, to at least one (e.g. one, more or all) of the following: the at least one second contact pad 114, the at least one first contact pad 104, the rear metallization layer 116m. For example, the at least one second contact pad 114 may be electrically connected 510e to a gate region of the integrated circuit structure 510, e.g. a gate of a transistor. Alternatively or additionally, the at least one first contact pad 104 may be electrically connected 510*e* to a first source/drain region (in other words, a region, which may configured as source region and/or drain region) of the integrated circuit structure 510, e.g. a first source/drain of a transistor. Alternatively or additionally, the rear metallization layer 116*m* may be electrically connected 510*e* to a second source/drain region (in other words, a region, which may configured as source region and/or drain region) of the integrated circuit structure 510, e.g. a second source/drain of a transistor.

Forming one or more electrical circuit components of semiconductor device 500*b* (e.g. an integrated circuit structure) may include forming various types of a transistors, such as among others may be a field-effect transistor (FET), a junction field-effect transistor, a metal-oxide-semiconductor field-effect transistor (MOSFET), a dual-gate MOSFET, a fast-reverse or fast-recovery epitaxial diode FET, a heterostructure insulated gate FET, a modulation-doped FET, a tunnel FET, an insulated-gate bipolar transistor (IGBT). In dependency of the specific semiconductor technology in which an electrical circuit component is fabricated, various materials are processed for forming the corresponding layers. For example, an electrical circuit component (e.g. a transistor) may be processed in complementary metal-oxide-semiconductor (CMOS) technology and/or in double-diffused metal-oxide-semiconductor (DMOS) technology.

Forming a transistor may include forming a gate region from of an electrically conductive material (e.g. a polycrystalline semiconductor), forming a source region from of an electrically conductive material (e.g. a first doped semiconductor), forming a drain region from of an electrically conductive material (e.g. a second doped semiconductor) and forming a gate dielectric (also referred to as gate dielectric region) from a dielectric material between the gate region and the drain region and/or the source region.

In analogy, other types of electrical circuit components may be formed, such as a capacitor, a thyristor, a resistor, etc. An integrated circuit structure may be a minor complex integrated circuit with less than about several tens or several hundreds of electrical circuit components or a highly complex integrated circuit with up to several millions or several billions of electrical circuit components.

FIG. 6A to FIG. 6D respectively show a semiconductor device according to various embodiments in a cross-sectional view or a schematic side view in a method according to various embodiments, e.g. in the method 200. The process steps illustrated in FIG. 6A to FIG. 6D may be optional to the previous described process steps, e.g. alternatively or additionally to the previous described process steps.

Figure 6A:
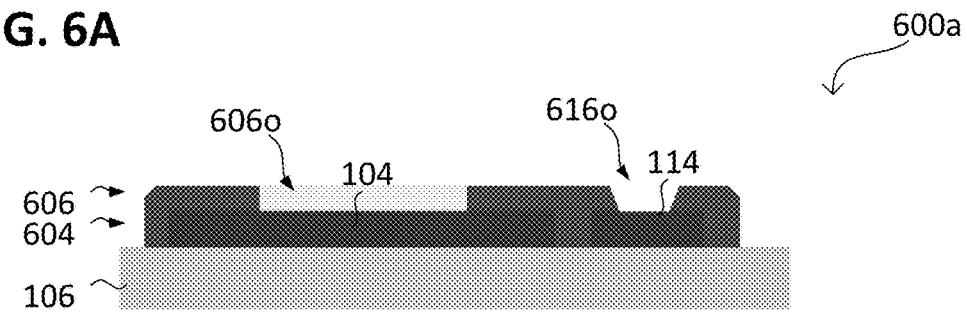
FIG. 6A to FIG. 6D respectively show a semiconductor device according to various embodiments in a cross-sectional view or a schematic side view in a method according to various embodiments.

As illustrated in FIG. 6A, a semiconductor device 600*a* according to various embodiments may include the least one first contact pad 104 and the at least one second contact pad 114.

The at least one second contact pad 114 may be formed similar to the at least one first contact pad 104, e.g. from the same material, e.g. simultaneously. For example, forming the at least one second contact pad 114 and forming the at least one first contact pad 104 may include forming an electrically conductive layer 604. The electrically conductive layer 604 may be formed using a mask, such that the electrically conductive layer 604 includes at least two (e.g. electrically) separated segments, wherein at least one first segment of the at least two segments forms the at least one first contact pad 104 and at least one second segment of the at least two segments forms the at least one second contact pad 114. Alternatively or additionally, the electrically conductive layer 604 may be structured, e.g. using a mask, e.g. by etching, to separate the electrically conductive layer 604 into at least two segments. In other words, material may be removed from the electrically conductive layer 604 to form separate contact pads, e.g. the at least one second contact pad 114 and/or the at least one first contact pad 104.

For example, the at least one second contact pad 114 and the at least one first contact pad 104 may be formed in one and the same process step(s), e.g. from the same electrically conductive layer. Alternatively, the at least one second contact pad 114 and the at least one first contact pad 104 may be formed in different process steps, e.g. from different electrically conductive layers.

According to various embodiments, the electrically conductive layer 604 (e.g. the at least one second contact pad 114 and/or the at least one first contact pad 104) may have a thickness of less than or equal to about 10 μm, e.g. of less than or equal to about 5 μm, e.g. of less than or equal to about 3 μm, e.g. of less than or equal to about 2 μm, e.g. in the range of about 1 μm to about 5 μm (e.g. in the case of soldering) or in the range of about 5 μm to about 10 μm (e.g. in the case of bonding).

According to various embodiments, the electrically conductive layer 604 may include or may be formed from an electrically conductive material, the electrically conductive material may include a metal, e.g. Al or Cu. Optionally, the electrically conductive material may include a semiconducting material, e.g. Si (e.g. if the electrically conductive material is disposed on a device body 106 including the semiconducting material). This enables to avoid the formation of voids between the device body 106 and the electrically conductive layer 604.

According to various embodiments, the method may optionally include forming an electrically insulating layer 606 (may be also referred to as passivation layer) on the front side of the semiconductor device 600*a* (e.g. at least partially over the device body 106 and/or at least partially over the electrically conductive layer 604). The electrically insulating layer 606 may include or may be formed from an electrically insulating material, e.g. an electrically insulating polymer (e.g. a polyimide or a resin), e.g. a dielectric polymer. Forming the electrically insulating layer 606 may include disposing the electrically insulating material at least partially over the device body 106 and/or at least partially over the electrically conductive layer 604 (e.g. after the at least one second contact pad 114 and/or the at least one first contact pad 104 are formed).

The electrically insulating layer 606 may provide adhesion to mold materials for packaging the semiconductor device.

The electrically insulating layer 606 may be formed, e.g. deposited, using a mask, e.g. to form at least one first opening 606*o* and/or at least one second opening 616*o*. The electrically insulating layer 606 may include at least the at least one first opening 606*o*, which exposes the at least one first contact pad 104 at least partially, e.g. which exposes a surface (contact pad surface) of the at least one first contact pad 104 at least partially. The electrically insulating layer 606 may further include at least the at least one second opening 616*o*, which exposes the at least one second contact pad 114 at least partially, e.g. which exposes a surface (contact pad surface) of the at least one second contact pad 114 at least partially.

Alternatively or additionally, the electrically insulating layer 606 may be structured, e.g. using a mask, e.g. by etching, to form the at least one first opening 606*o* and/or the at least one second opening 616*o*. In other words, material may be removed from the electrically insulating layer 606 to form the at least one first opening 606o and/or the at least one second opening 616o and expose the at least one first contact pad 104 at least partially and/or the at least one second contact pad 114 at least partially.

Optionally, the method may include a cleaning-step. The cleaning-step may include removing material from the at least one first contact pad 104 (e.g. from the contact pad surface), e.g. by etching or sputtering (e.g. using Argon ions). Removing material from the at least one first contact pad 104 may include removing an oxidation layer (e.g. an oxide of the electrically conductive material, e.g. aluminium oxide and/or copper oxide) of the at least one first contact pad 104. By removing material from the at least one first contact pad 104 an electrically conductive material of the at least one first contact pad 104 may be exposed, e.g. an electrically conductive surface may be formed, e.g. a metallic surface of the at least one first contact pad 104.

Optionally, the cleaning-step may include removing material from the at least one second contact pad 114 (e.g. from the contact pad surface), e.g. by etching or sputtering (e.g. using Argon ions). Removing material from the at least one second contact pad 104 may include removing an oxidation layer (e.g. an oxide of the electrically conductive material, e.g. aluminium oxide and/or copper oxide) of the at least one second contact pad 114. By removing material from the at least one second contact pad 114 an electrically conductive material of the at least one second contact pad 114 may be exposed, e.g. an electrically conductive surface may be formed, e.g. a metallic surface of the at least one second contact pad 114.

Removing material from the at least one first contact pad 104 and/or from the at least one second contact pad 114 may enhance adhering a layer, e.g. the adhesion layer 102a and/or the barrier layer 102b (if it is present), to the at least one first contact pad 104 and/or the at least one second contact pad 114. Removing material from the at least one first contact pad 104 may enhance the electrical contact of the layer, e.g. the adhesion layer 102a and/or the barrier layer 102b (if it is present), to the at least one first contact pad 104 and/or to the at least one second contact pad 114.

Optionally, the electrically insulating layer 606 may be formed by disposing other materials on the front side of the semiconductor device (e.g. at least partially over the device body 106 and/or at least partially over the electrically conductive layer 604) and transforming them into an electrically insulation material, e.g. by a chemical reaction, e.g. by oxidation, e.g. by thermal oxidation or wet oxidation.

Figure 6B:
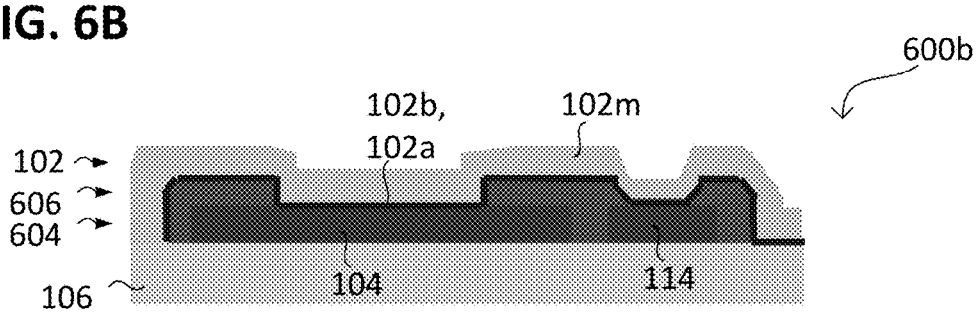
Figure 6C:
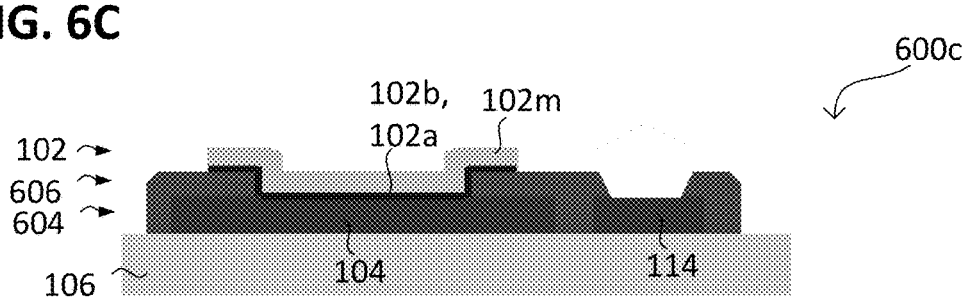
Figure 6D:
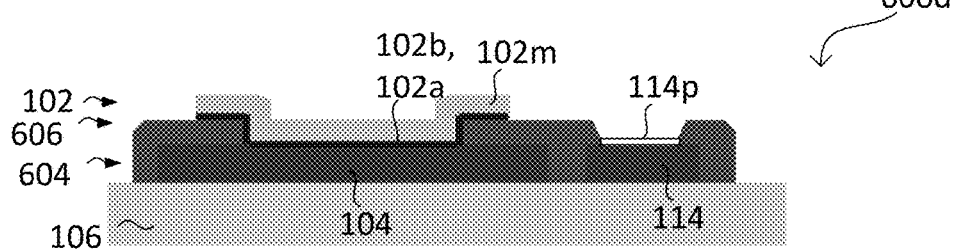

As illustrated in FIG. 6B, a semiconductor device 600b according to various embodiments may include the layer stack 102.

The layer stack 102 may include or may be formed from at least the adhesion layer 102a and the metallization layer 102m, and optionally the barrier layer 102b. The metallization layer 102m may include or may be formed from at least the second metal, e.g. in form of the second metal layer. For example, the metallization layer 102m, e.g. the second metal layer, (e.g. in this step, e.g. before forming the metallization alloy) may include a concentration of the second metal greater than or equal to about 50 at. %, e.g. greater than or equal to about 60 at. %, e.g. greater than or equal to about 70 at. %, e.g. greater than or equal to about 80 at. %, e.g. greater than or equal to about 90 at. %, e.g. greater than or equal to about 99 at. %. For example, the metallization layer 102m may be formed from substantially the second metal (besides impurities, e.g. other chemical elements).

The layer stack 102 may be formed at least partially over the at least one first contact pad 104 and at least partially over the at least one second contact pad 114. The layer stack 102 may at least partially be in physical contact to the at least one first contact pad 104 and/or the at least one second contact pad 114. The layer stack 102 may at least partially be in physical contact to the insulating layer 606. The insulating layer 606 may be formed at least partially between the layer stack 102 and the device body 106.

The thickness of the adhesion layer 102a and/or the thickness of the barrier layer 102b (if it is present) may be adjusted according to the requirements, e.g. the layer system of the semiconductor device. For example, the adhesion layer 102a and/or the barrier layer 102b (if it is present) may have a thickness as described before.

Alternatively or additionally, the thickness of the metallization layer 102m, e.g. the second metal layer, may be adjusted according to the requirements, e.g. according to the wafer/chip bow restrictions, to the solder system (e.g. the specific solder material), and/or to the desired spreading resistance of the layer stack 102.

The adhesion layer 102a includes at least one material (one or more materials, e.g. all materials) selected from a group of materials, the group consisting of: a third metal, a metal alloy (different from the metallization alloy) including at least the third metal, e.g. a third metal based alloy (a metal alloy based on the third metal, e.g. with the third metal as major component), e.g. a Ti based alloy. A concentration of the third metal (e.g. Ti) in the adhesion layer 102a (e.g. in the third metal based alloy), may be greater than or equal to about 50 at. % (in other words, the adhesion layer 102a, e.g. the third metal based alloy respectively, may be based on the third metal), e.g. greater than or equal to about 60 at. %, e.g. greater than or equal to about 70 at. %, e.g. greater than or equal to about 80 at. %, e.g. greater than or equal to about 90 at. %, e.g. the adhesion layer 102a, e.g. the third metal based alloy, may be formed substantially from the third metal, e.g. a concentration of the third metal in the adhesion layer 102a may be greater than or equal to about 95 at. %, e.g. greater than or equal to about 99 at. %.

Alternatively or additionally, the barrier layer 102b includes at least one material (one or more materials, e.g. all materials) selected from a group of materials, the group consisting of: a fourth metal (e.g. W), the third metal, a metal alloy including at least the third metal and the fourth metal. The metal alloy may be a fourth metal based alloy (different from the metal alloy of the adhesion layer 102a and/or different from the metallization alloy), e.g. a W based alloy including Ti. A concentration of the third metal (e.g. Ti) in the barrier layer 102b, e.g. in the fourth metal based alloy (a metal alloy based on the fourth metal, e.g. with the fourth metal as major component), may be less than or equal to about 30 at. %, e.g. less than or equal to about 25 at. %, e.g. less than or equal to about 20 at. %, e.g. less than or equal to about 15 at. %, e.g. less than or equal to about 10 at. %, in the range from about 10 at. % to about 30 at. %. The adhesion layer 102a may be substantially free of the fourth metal.

According to various embodiments, a concentration of the fourth metal (e.g. W) in the barrier layer 102b, e.g. in the fourth metal based alloy, may be greater than or equal to about 70 at. % (in other words, the barrier layer 102b, e.g. the fourth metal based alloy respectively, may be based on the fourth metal), e.g. greater than or equal to about 75 at. %, e.g. greater than or equal to about 80 at. %, e.g. greater than or equal to about 85 at. %, e.g. greater than or equal to about 90 at. %.

According to various embodiments, a concentration of the fourth metal based alloy (e.g. a TiW alloy which is based on W) in the barrier layer 102b, may be greater than or equal to about 50 at. %, e.g. greater than or equal to about 60 at. %, e.g. greater than or equal to about 70 at. %, e.g. greater than or equal to about 80 at. %, e.g. greater than or equal to about 90 at. %, e.g. the barrier layer 102b may be formed substantially from the fourth metal based alloy, e.g. a concentration of fourth metal based alloy in the barrier layer 102b may be greater than or equal to about 95 at. %, e.g. greater than or equal to about 99 at. %.

According to various embodiments, the adhesion layer 102a is configured to provide an adhesion force between the metallization alloy of the metallization layer 102m and the at least one first contact pad 104, e.g. between the metallization alloy of the metallization layer 102m and the barrier layer 102b, of greater than or equal to about 0.1 kg/m$^2$, e.g. of greater than or equal to about 0.5 kg/m$^2$, e.g. of greater than or equal to about 1 kg/m$^2$, e.g. in the range of about 0.5 kg/m to about 5 kg/m.

According to various embodiments, the barrier layer 102b may include or may be formed substantially from TiW alloy. Alternatively or additionally, the adhesion layer 102a may include or may be formed substantially from Ti. Alternatively or additionally, the metallization layer 102m may include or may be formed substantially from Cu. Optionally, the barrier layer 102b may include other metals, e.g. Ni or V.

As illustrated in FIG. 6B, a semiconductor device 600b according to various embodiments may include the least one second contact pad 114 exposed at least partially, e.g. at least partially free from at least one of the following: the barrier layer 102b, the metallization layer 102m, the adhesion layer 102a, the electrically insulating layer 606.

Forming the layer stack 102 may include a structuring-step as described in the following.

In a first part of the structuring-step, the metallization layer 102m may be structured. The metallization layer 102m may be formed similar, e.g. identical, to the metallization layer 102m described in FIG. 6B. For example, the metallization layer 102m may include or may be formed from a Cu-layer. The metallization layer 102m may be structured by etching or sputtering. The metallization layer 102m may be structured, e.g. etched, such, that at least the adhesion layer 102a and/or at least the barrier layer 102b may be used as etch stop. In other words, at least the adhesion layer 102a and/or at least the barrier layer 102b may be inert (e.g. chemical stable) regarding structuring the metallization layer 102m. Illustratively, the electrically conductive layer (e.g. the at least one first contact pad 104 and/or the at least one second contact pad 114) and/or the insulating layer 606 may substantially be not affected (sustain) during structuring the metallization layer 102m, e.g. due to the protection of the adhesion layer 102a and/or of the barrier layer 102b. For example, etching the metallization layer 102m (e.g. in form of a Cu-layer) may not affect the adhesion layer 102a (e.g. in form of a Ti-layer) and/or the barrier layer 102b (e.g. in form of a TiW alloy-layer), if the barrier layer 102b is present.

Structuring the metallization layer 102m may include exposing the adhesion layer 102a and/or the barrier layer 102b at least partially, e.g. at least over the at least one second contact pad 114.

In a second part of the structuring-step, the adhesion layer 102a may be structured, e.g. by etching, e.g. using a first etching agent (also referred to as first etchant), e.g. an acid. According to various embodiments, the first etching agent may include or may be formed from hydrofluoric acid (HF). Structuring the adhesion layer 102a may include exposing the barrier layer 102b at least partially, if the barrier layer 102b is present, e.g. at least over the at least one second contact pad 114. Structuring the adhesion layer 102a may include exposing at least the at least one second contact pad 114, e.g. if no barrier layer 102b is present.

The adhesion layer 102a may be structured, e.g. etched, such, that at least the barrier layer 102b (if it is present) may be used as etch stop (for the first etching agent). In other words, at least the barrier layer 102b may be inert (e.g. chemical stable) regarding structuring the adhesion layer 102a, e.g. inert (e.g. chemical stable) to the first etching agent. Illustratively, the electrically conductive layer (e.g. the at least one first contact pad 104 and/or the at least one second contact pad 114) and/or the insulating layer 606 may not be affected (sustain) during structuring the adhesion layer 102a, e.g. by the first etching agent, e.g. due to the protection by the barrier layer 102b. For example, etching the adhesion layer 102a (e.g. in form of a Ti-layer) may substantially not affect the barrier layer 102b (e.g. in form of a TiW alloy-layer). In other words, the first etching agent may be configured to stop etching at the barrier layer 102b.

If no barrier layer 102b is present, structuring the adhesion layer 102a may include exposing the insulating layer 606 at least partially and/or the at least one second contact pad 114 at least partially.

In an optional third part of the structuring-step, the barrier layer 102b may be structured, if the barrier layer 102b is present, e.g. by etching, e.g. using a second etching agent (also referred to as second etchant), e.g. an acid. According to various embodiments, the second etching agent may include or may be formed from $H_2O_2$. Structuring the barrier layer 102b may include exposing the insulating layer 606 at least partially and/or the at least one second contact pad 114 at least partially.

According to various embodiments, the second etching agent including or formed from $H_2O_2$ (e.g. in form of a soft $H_2O_2$ etchant) may be chosen when the barrier layer 102b includes or is formed from TiW alloy, and e.g. when the adhesion layer 102a includes or is formed from Ti. Illustratively, this may provide a stable adhesion layer 102a since Ti is substantially not (in other words hardly) affected (sustain) by $H_2O_2$ (e.g. in form of a soft $H_2O_2$ etchant).

The barrier layer 102b may be structured, e.g. etched, such, that at least the insulating layer 606 and/or at least the at least one second contact pad 114 may be used as etch stop (for the second etching agent). In other words, at least the insulating layer 606, the device body 106 and/or at least the at least one second contact pad 114 may be inert (e.g. chemical stable) regarding structuring barrier layer 102b, e.g. inert (e.g. chemical stable) to the second etching agent. Illustratively, the electrically conductive layer (e.g. the at least one first contact pad 104 and/or the at least one second contact pad 114), the device body 106 and/or the insulating layer 606 may not be affected (sustain) during structuring the barrier layer 102b, e.g. by the second etching agent, e.g. due to their stability regarding the second etching agent. For example, etching the barrier layer 102b (e.g. in form of a TiW alloy-layer) may not affect the electrically conductive layer 604 (e.g. formed from at least Al, e.g. in form of a Al-layer), the device body 106 (e.g. formed from Si, e.g. as part of a Si-substrate) and/or the insulating layer 606 (formed from imide, e.g. in form of a imide layer). In other words, the second etching agent may be configured to stop etching at the electrically conductive layer 604 (e.g. the at least one second contact pad 114), the device body 106 and/or the insulating layer 606. Optionally, oxide materials (e.g. in form of an oxide layer, e.g. a metal oxide layer) may be used to protect desired regions of the semiconductor device 600c, if necessary.

In the structuring-step also remaining impurities (e.g. Aluminium oxide from the cleaning-step) may be removed from the insulating layer 606. This may provide reducing leakage currents during operating the semiconductor device.

As illustrated in FIG. 6B, a semiconductor device 600b according to various embodiments may include a reaction layer 114p at least partially over the at least one second contact pad 114p.

The method may optionally include a passivation-step. The passivation-step my include forming a reaction layer 114p on the at least one second contact pad 114 of the semiconductor device, e.g. using a reaction agent. The reaction agent may be gaseous. Alternatively or additionally, the reaction agent may include at least oxygen. The reaction agent (e.g. the oxygen) may be activated for forming the reaction layer 114p, e.g. the reaction agent may include oxygen plasma.

The reaction layer 114p may be formed partially from at least one second contact pad 114, e.g. partially consuming the material of the at least one second contact pad 114 (e.g. by oxidizing the material of the at least one second contact pad 114 at least partially), e.g. consuming the contact pad surface of the at least one second contact pad 114 (and transformed into the metallization alloy).

According to various embodiments, the reaction layer 114p may provide forming a well-defined surface quality (e.g. oxide quality) of the exposed at least one second contact pad 114 (e.g. an at least one second Al contact pad 114), for example, in order to provide a stable surface quality for wire bonding and/or for protection against corrosion during further process steps, e.g. during dicing the device body 106 from a wafer, e.g. in de-ionized (DI) water, and/or during reflow process in combination with chemical agents (e.g. flux solvent).

According to various embodiments, the reaction layer 114p may provide forming a well-defined surface of the electrically insulating layer 606 (e.g. an imide surface) for enhancing adhesion to mold compound (e.g. in encasing the semiconductor device, e.g. into a supporting material).

The passivation-step may provide drying the electrically insulating layer 606, e.g. if the electrically insulating layer 606 is formed from a fluid. The passivation-step may provide minimization of leakage currents.

Figure 7A:
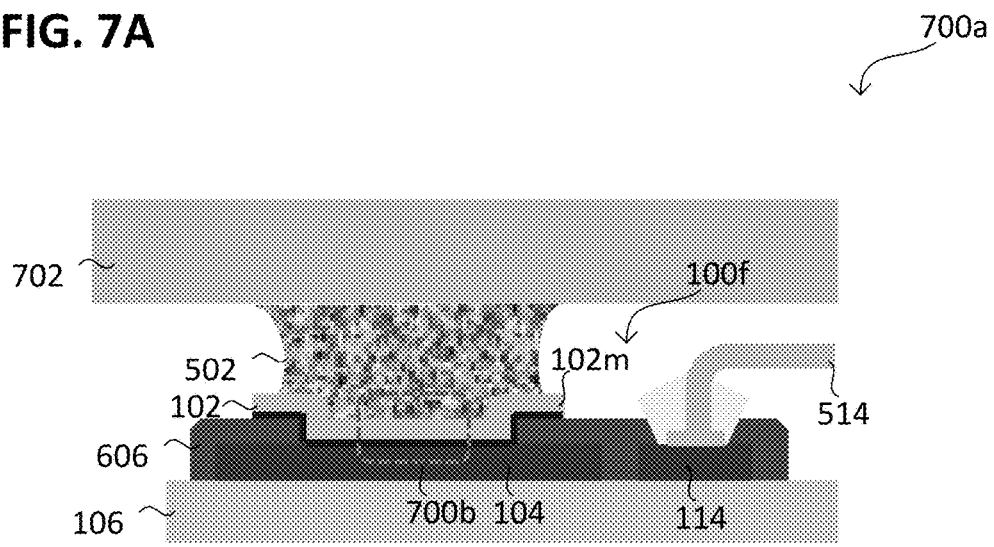
FIG. 7A and FIG. 7B respectively show a semiconductor device according to various embodiments in a cross-sectional view or a schematic side view in a method according to various embodiments.
Figure 7B:
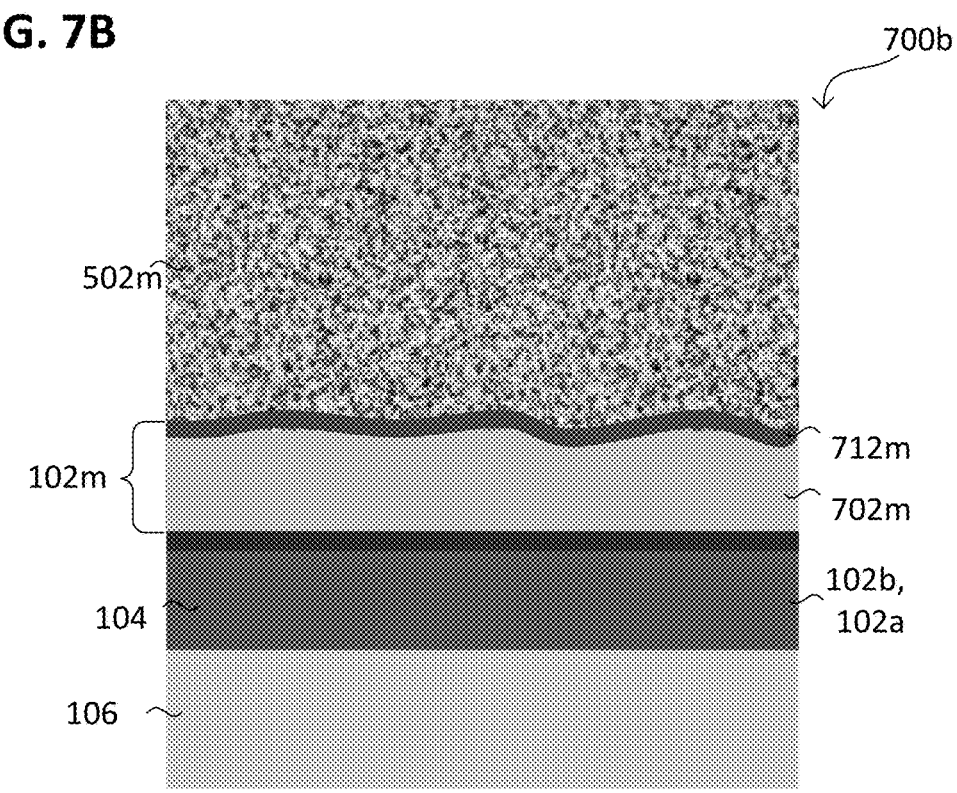

FIG. 7A shows a semiconductor device 700a according to various embodiments in a cross-sectional view or a schematic side view in a method according to various embodiments; and FIG. 7B respectively shows the semiconductor device 700a or another semiconductor device, as described herein, in a detailed cross-sectional view 700b or a schematic side view 700b.

The semiconductor device 700a may be similar or equal to the semiconductor device 600d, wherein in a further step (also referred to as contacting-step) the at least one first contact pad 104 and/or the at least one second contact pad 114 may be electrically contacted.

The semiconductor device 700a may include a device body 106, e.g. as part of a semiconductor substrate, at least one first contact pad 104, at least one second contact pad 114, an insulating layer 606, a layer stack 102, at least one solder joint 502, at least one bonding wire 514 and a contact structure 702 (e.g. a clip, also referred to as lead frame). The contact structure 702 may include at least a contact terminal (not shown) for contacting the semiconductor device 700a to a peripheral device.

The at least one solder joint 502 may electrically connect the at least one first contact pad 104 to at least one first region of the contact structure 702. The at least one first region may be electrically contacted to at least one first contact terminal of the contact structure 702. For example, the semiconductor device 700a may include more than one first contact pad 104, wherein the contact structure 702 may include more than one contact terminal, wherein each contact pad of the more than one first contact pad 104 may correspond one contact terminal of the more than one first contact terminals. For example, each contact pad of the more than one first contact pad 104 may be electrically connected to one contact terminal of the more than one first contact terminals, e.g. through a corresponding solder joint of the at least one solder joint 502.

According to various embodiments, the at least one bonding wire 514 may electrically connect the at least one second contact pad 114 to at least one second region of the contact structure 702. The at least one second region may be electrically contacted to at least one second contact terminal of the contact structure 702. For example, the semiconductor device 700a may include more than one second contact pad 114, wherein the contact structure 702 may include more than one contact terminal, wherein each contact pad of the more than one second contact pad 114 may correspond one contact terminal of the more than one second contact terminals. For example, each contact pad of the more than one second contact pad 114 may be electrically connected to one contact terminal of the more than one second contact terminals, e.g. through one bonding wire of the at least one bonding wire 514.

As illustrated in FIG. 7B, a semiconductor device may include a first metal 502m disposed on the metallization layer 102m. The first metal 502m may be part of a solder material, e.g. being part of a solder joint. Further the metallization layer 102m may include the second metal 702m, e.g. in form of a second metal layer. Further, the metallization layer 102m may include the metal alloy 712m (also referred as to metallization alloy 712m), wherein the alloy may include the first metal 502m and the second metal 702m. The metallization alloy 712m may be formed as a metallization alloy layer. The metallization alloy layer may extend between the first metal 502m and the second metal 702m, e.g. in physical contact with both.

The metallization alloy 712m may be formed from at least the first metal 502m and the second metal 702m. Therefore, atoms of at least the first metal 502m and the second metal 702m may move (e.g. diffuse) into each other, e.g. into the metallization alloy 712m. The first metal 502m and the second metal 702m may be consumed to form the metallization alloy 712m. Illustratively, the first metal 502m and the second metal 702m are transformed into the metallization alloy 712m. For example, forming the metallization alloy 712m may be induced and/or accelerated with increasing temperature of the first metal 502m and the second metal 702m (e.g. by heating them to a temperature greater than the melting temperature of the solder material). Therefore, the first metal 502m and the second metal 702m may be heated to form the metallization alloy 712m, e.g. by melting at least the first metal 502m, e.g. by melting at least the solder material. For example, the metallization alloy 712m may be formed by soldering substantially (vertically) through the metallization layer 102m. In other words, the metallization alloy 712m may extend substantially (vertically) through the metallization layer 102m. According to various embodiments, the adhesion layer 102a may be used as solder stop. In other words, the first metal may diffuse from the solder material substantially through the metallization layer 102m to the adhesion layer 102a.

The more first metal 502m and/or the more second metal 702m are provided for forming the metallization alloy 712m, the more metallization alloy may be formed, e.g. the thicker the metallization alloy layer may be, e.g. the thicker the metallization layer 102m may be. For example, over time, e.g. during contacting the at least one first contact pad 104 (e.g. during the contacting-step), the thickness of the metallization alloy layer may increase. For example, the thickness of the metallization alloy layer may increase until the first metal 502m is substantially consumed and/or until the second metal 702m is substantially consumed.

According to various embodiments, at least the second metal 702m is substantially consumed. Alternatively or additionally, at least the first metal 502m is substantially consumed. For example, the first metal 502m may be supplied by the solder material until the first metal 702m is transformed substantially completely into the metallization alloy 712m.

Figure 8:
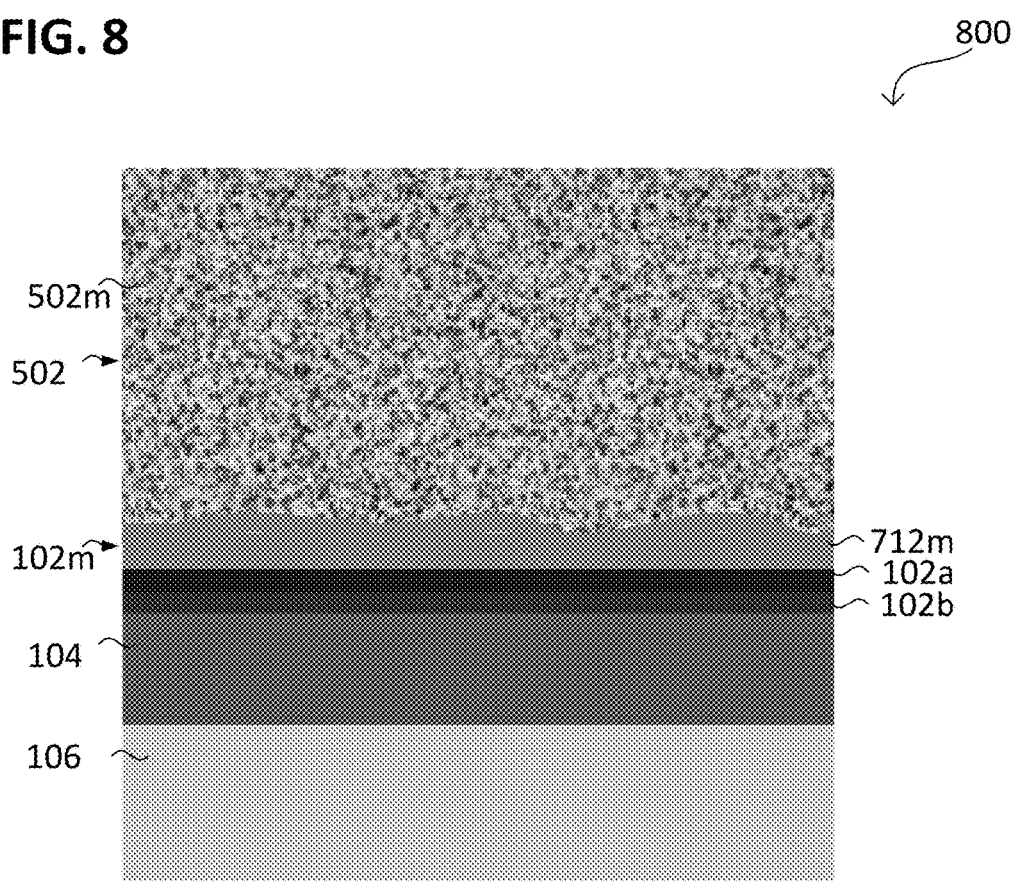
FIG. 8 shows a semiconductor device according to various embodiments in a cross-sectional view or a schematic side view in a method according to various embodiments.

FIG. 8 shows a semiconductor device 800 according to various embodiments in a cross-sectional view or a schematic side view in a method according to various embodiments.

According to various embodiments, the metallization alloy 712m may substantially extend between the solder joint 502 and the adhesion layer 102a. In this case, the first metal 702m is transformed substantially completely into the metallization alloy 712m. In other words, the metallization layer 102m is formed substantially from the metallization alloy 712m.

For example, substantially the complete interface between the metallization layer 102m and the adhesion layer 102a is a metallization alloy-adhesion layer interface. In other words, the adhesion layer 102a substantially extends between the metallization alloy 712m and the at least one first contact pad 104 or between the metallization alloy 712m and the barrier layer 102b, if the barrier layer 102b is present.

This enables to enhance the adhesion between the metallization layer 102m and the barrier layer 102b, e.g. if the metallization layer 102m includes a high concentration of the metal alloy 712 (metallization alloy 712m), e.g. after the contacting-step, e.g. a concentration of metallization alloy 712m greater than or equal to about 50 at. %, e.g. greater than or equal to about 60 at. %, e.g. greater than or equal to about 70 at. %, e.g. greater than or equal to about 80 at. %, e.g. greater than or equal to about 90 at. %, e.g. the metallization layer 102m may be formed substantially from the metallization alloy 712m, e.g. a concentration of metallization alloy 712m in the metallization layer 102m may be greater than or equal to about 95 at. %, e.g. greater than or equal to about 99 at. %.

Further, various embodiments will be described in the following:

1. A semiconductor device may include:
   at least one first contact pad on a front side of the semiconductor device;
   at least one second contact pad on the front side of the semiconductor device;
   a layer stack disposed at least partially over the at least one first contact pad,
   wherein the at least one second contact pad is at least partially free of the layer stack;
   wherein the layer stack includes at least an adhesion layer and a metallization layer; and
   wherein the metallization layer includes a metal alloy and wherein the adhesion layer is disposed between the metallization layer and the at least one first contact pad for adhering the metal alloy of the metallization layer to the at least one first contact pad.
2. The semiconductor device of clause 1,
   wherein the layer stack further includes a barrier layer disposed between the adhesion layer and the at least one first contact pad.
3. A semiconductor device may include:
   at least one first contact pad on a front side of the semiconductor device;
   at least one second contact pad on the front side of the semiconductor device;
   a layer stack disposed at least partially over the at least one first contact pad,
   wherein the at least one second contact pad is at least partially free of the layer stack;
   wherein the layer stack includes at least an adhesion layer and a metallization layer; and
   wherein the metallization layer includes a metal alloy and wherein the adhesion layer is disposed between the metallization layer and the barrier layer for adhering the metal alloy of the metallization layer to the barrier layer.
4. The semiconductor device one of the clauses 1 to 3,
   wherein the metal alloy of the metallization layer is at least partially in physical contact to the adhesion layer and/or disposed at least partially at the interface of the of the adhesion layer and the metallization layer.
5. The semiconductor device of one of the clauses 1 to 4 may further include:
   at least one electrical circuit component (e.g. including one source/drain region) which is electrically connected to the at least one first contact pad and/or to the at least one second contact pad.
6. The semiconductor device of one of the clauses 1 to 5 may further include:
   at least one rear metallization layer on a rear side of the semiconductor device opposite the front side of the semiconductor device (e.g. the rear metallization may be connected to the at least one electrical circuit component).
7. The semiconductor device one of the clauses 1 to 6 may further include:
   a bonding wire, wherein the at least one second contact pad is electrically contacted by the bonding wire.
8. The semiconductor device of one of the clauses 1 to 6 may further include:
   a solder material disposed at least partially over the metallization layer and/or
   a solder joint including the solder material, wherein the solder joint is disposed at least partially over the metallization layer.
9. The semiconductor device of clause 8,
   wherein the solder material is substantially free of Pb.
10. The semiconductor device of clause 8 or 9,
    wherein the solder material includes a melting temperature of greater than about 220° C.
11. The semiconductor device of one of the clauses 8 to 10,
    wherein the solder material and the metal alloy of the metallization layer include at least a first metal.

12. The semiconductor device of clause 11,
wherein a concentration of the first metal in the solder joint is greater than or equal to about 20 at. %.

13. The semiconductor device of clause 11 or 12,
wherein a concentration of the first metal in the metallization layer is smaller than or equal to about 80 at. %.

14. The semiconductor device of one of the clauses 11 to 13,
wherein the first metal is Sn.

15. The semiconductor device of one of the clauses 11 to 14,
wherein the metal alloy of the metallization layer includes at least a second metal different from the first metall.

16. The semiconductor device of clause 15,
wherein the second metal is Cu.

17. The semiconductor device of one of the clauses 1 to 16,
wherein the metallization layer has a thickness of less than or equal to about 5 µm.

18. The semiconductor device of one of the clauses 2 to 17,
wherein the barrier layer has a thickness of less than or equal to about 0.5 µm.

19. The semiconductor device of one of the clauses 1 to 18,
wherein the adhesion layer has a thickness of less than or equal to about 0.5 µm.

20. The semiconductor device of clause 18 or 19,
wherein the barrier layer and/or the adhesion layer have a thickness of less than or equal to about 300 nm.

21. The semiconductor device of clause 18, 19, or 20,
wherein the barrier layer and/or the adhesion layer have a thickness of less than or equal to about 200 nm.

22. The semiconductor device of one of the clauses 1 to 21,
wherein the semiconductor device is configured as a power semiconductor device.

23. The semiconductor device of one of the clauses 1 to 22,
wherein the adhesion layer includes at least one material selected from a group of materials, the group consisting of: a third metal, a third metal based alloy including the third metal; and/or
wherein the barrier layer includes at least one material selected from a group of materials, the group consisting of: a fourth metal, the third metal, a fourth metal based alloy including the third metal.

24. The semiconductor device of clause 23,
wherein the metal alloy of the barrier layer and/or the metal alloy of the adhesion layer is different from the metal alloy of the metallization layer.

25. The semiconductor device of clause 1 to 24,
wherein a concentration of a third metal in the barrier layer is less than or equal to about 30 at. %.

26. The semiconductor device of one of the clauses 1 to 25,
wherein a concentration of a third metal in the barrier layer is in the range from about 10 at. % to about 30 at. %.

27. The semiconductor device of one of the clauses 23 to 26
wherein the third metal is Ti and/or wherein the fourth metal is W.

28. The semiconductor device of one of the clauses 23 or 24,
wherein a concentration of the third metal in the adhesion layer is greater than a concentration of the third metal in the barrier layer.

29. The semiconductor device of one of the clauses 1 to 28,
wherein the adhesion layer includes at least Ti and/or wherein the barrier layer includes at least Ti and W (e.g. wherein Ti and W may form the fourth metal based alloy of the barrier layer).

30. The semiconductor device of one of the clauses 1 to 29,
wherein a concentration of the third metal in the adhesion layer is greater than about 50 at. %.

31. The semiconductor device of clause 30,
wherein a concentration of the third metal in the adhesion layer is greater than or equal to about 60 at. %.

32. The semiconductor device of clause 31,
wherein a concentration of the third metal in the adhesion layer is greater than or equal to about 80 at. %.

33. The semiconductor device of one of the clauses 1 to 32,
wherein the adhesion layer is configured to provide an adhesion force between the metal alloy of the metallization layer and the at least one first contact pad and/or the barrier layer of greater than or equal to about 0.1 kg/m².

34. A method for manufacturing a semiconductor device, the method may include:
forming at least one first contact pad on a front side of the semiconductor device and at least one second contact pad on the front side of the semiconductor device;
forming a layer stack at least partially over the at least one first contact pad, such that the at least one second contact pad is free of the layer stack;
wherein the layer stack includes at least an adhesion layer and a metallization layer; and
wherein the metallization layer includes a metal alloy and wherein the adhesion layer is disposed between the metallization layer and the at least one first contact pad for adhering the metal alloy of the metallization layer to the at least one first contact pad.

35. The method of clause 34,
wherein the layer stack further includes a barrier layer disposed between the adhesion layer and the at least one first contact pad 36. A method for manufacturing a semiconductor device, the method may include:
forming at least one first contact pad on a front side of the semiconductor device and at least one second contact pad on the front side of the semiconductor device;
forming a layer stack at least partially over the at least one first contact pad, such that the at least one second contact pad is free of the layer stack;
wherein the layer stack includes at least a barrier layer, an adhesion layer and a metallization layer; and
wherein the metallization layer includes a metal alloy and wherein the adhesion layer is disposed between the metallization layer and the barrier layer for adhering the metal alloy of the metallization layer to the barrier layer.

37. The method of one of the clauses 34 to 36,
wherein forming a layer stack includes forming the adhesion layer and the metallization layer at least partially over the at least one first contact pad.

38. The method of one of the clauses 34 to 37,
wherein forming the layer stack includes structuring the metallization layer to expose the adhesion layer at least partially.
39. The method of one of the clauses 34 to 38, wherein forming the layer stack includes:
structuring the layer stack to expose the at least one second contact pad at least partially.
40. The method of one of the clause 34 to 39, wherein forming the layer stack includes:
structuring the adhesion layer using a first etching agent; and/or
structuring the barrier layer using a second etching agent different from the first etching agent.
41. The method of clause 40,
wherein the barrier layer and/or the metallization layer are inert to the first etching agent.
42. The method of one of the clauses 40 or 41,
wherein at least one second contact pad and/or the metallization layer are inert to the second etching agent.
43. The method of one of the clauses 39 to 42,
wherein the first etching agent includes at least HF; and/or
wherein the second etching agent includes at least $H_2O_2$.
44. The method of one of the clauses 34 to 43 may further include:
forming solder material on the metallization layer.
45. The method of one of the clauses 34 to 44,
wherein forming the layer stack includes diffusing a first metal into the metallization layer to form the metal alloy of the metallization layer (e.g. after structuring the layer stack).
46. The method of clause 44 or 45,
wherein forming the layer stack includes disposing a second metal on the adhesion layer, wherein the second metal is used at least partially to form the metal alloy of the metallization layer.
47. The method of one of the clauses 36 to 46, wherein forming at least one first contact pad on a front side of the semiconductor device and at least one second contact pad on the front side of the semiconductor device includes:
disposing an electrically conductive layer over a semiconductor carrier of the semiconductor device;
structuring the electrically conductive layer to form the at least one first contact pad and/or to form the at least one second contact pad;
forming an electrically insulating layer at least partially on the front side of the semiconductor device and at least partially over the electrically conductive layer; wherein the electrically insulating layer includes at least one opening which exposes at least one contact pad surface of the at least one first contact pad and/or of the at least one second contact pad.
48. The method of clause 47,
wherein forming at least one first contact pad on a front side of the semiconductor device and at least one second contact pad on the front side of the semiconductor device includes removing material to expose an electrically conductive material of the at least one first contact pad and/or of the at least one second contact pad.
49. The method of clause 47 or 48,
wherein forming the layer stack includes structuring the barrier layer to expose the electrically insulating layer at least partially.
50. The method of one of the clauses 36 to 49 may further include:
forming a reaction layer on the at least one second contact pad of the semiconductor device using a reaction agent.
51. The method of clause 50,
wherein the reaction agent includes at least oxygen and/or the reaction agent is gaseous.
52. The method of clause 50 or 51,
wherein forming a reaction layer on the at least one second contact pad of the semiconductor device using the reaction agent includes exposing the at least the first side of the semiconductor device to a reaction agent.
53. The method of one of the clauses 34 to 52 may further include:
electrically connecting the at least one second contact pad of the semiconductor device using bonding.
54. The method of one of the clauses 34 to 53 may further include:
electrically connecting the at least one first contact pad of the semiconductor device using soldering.
55. The method of one of the clauses 39 to 54,
wherein the barrier layer and/or the metallization layer are used as an etch stop for the first etching agent.
56. The method of one of the clauses 39 to 55,
wherein the at least one second contact pad and/or the metallization layer are used as an etch stop for the second etching agent.
57. The method of one of the clauses 39,
wherein structuring the adhesion layer includes exposing the at least one first contact pad at least partially, exposing the at least one second contact pad at least partially and/or exposing the barrier layer at least partially; and/or
wherein structuring the barrier layer includes exposing the at least one second contact pad at least partially.
58. The method of clause 44 may further include:
forming the solder material includes forming at least one solder joint using the solder material.
59. The method of clause 44 and 45,
wherein the solder material includes the first metal.
60. The method of one of the clauses 34 to 59,
wherein the adhesion layer is used as solder stop.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are, therefore, intended to be embraced.

What is claimed is:

1. A semiconductor device, comprising:
at least one first contact pad on a front side of the semiconductor device;
at least one second contact pad on the front side of the semiconductor device;
a layer stack disposed at least partially over the at least one first contact pad, wherein a surface of the at least one second contact pad facing away from the semiconductor device is at least partially free of and uncovered by the layer stack;
wherein the layer stack comprises at least an adhesion layer and a metallization layer; and
wherein the metallization layer comprises a metal alloy and wherein the adhesion layer is disposed between the metallization layer and the at least one first contact pad for adhering the metal alloy of the metallization layer to the at least one first contact pad, wherein the semiconductor device further comprises a front surface on the front side of the semiconductor device and wherein the at least one first contact pad and the at least one second contact pad directly contact the front surface, wherein the layer stack further comprises a barrier layer disposed between the adhesion layer and the at least one first contact pad.

2. The semiconductor device of claim 1, further comprising:
at least one electrical circuit component which is electrically connected to the at least one first contact pad and/or to the at least one second contact pad.

3. The semiconductor device of claim 1, further comprising:
a bonding wire, wherein the at least one second contact pad is electrically contacted by the bonding wire.

4. The semiconductor device of claim 1, further comprising:
a solder material disposed at least partially over the metallization layer.

5. The semiconductor device of claim 4, further comprising:
wherein the solder material is substantially free of Pb.

6. The semiconductor device of claim 4,
wherein the solder material and the metal alloy of the metallization layer comprise at least a first metal.

7. The semiconductor device of claim 6,
wherein a concentration of the first metal in the metallization layer is smaller than or equal to about 80 at. %.

8. The semiconductor device of claim 6,
wherein the first metal is Sn.

9. The semiconductor device of claim 6,
wherein the metal alloy of the metallization layer comprises at least a second metal different from the first metall.

10. The semiconductor device of claim 9,
wherein the second metal is Cu.

11. The semiconductor device of claim 4, further comprising a bonding wire directly contacting and electrically connected to the at least one second contact pad.

12. The semiconductor device of claim 1,
wherein the adhesion layer comprises at least one material selected from a group of materials, the group consisting of: a third metal and/or a third metal based alloy.

13. The semiconductor device of claim 12,
wherein a concentration of the third metal in the adhesion layer is greater than about 50 at. %.

14. The semiconductor device of claim 12,
wherein the third metal is Ti.

15. The semiconductor device of claim 1, wherein the at least one first contact pad is disposed on a same level as the at least one second contact pad.

16. A method for manufacturing a semiconductor device, the method comprising:
forming at least one first contact pad on a front side of the semiconductor device and at least one second contact pad on the front side of the semiconductor device;
forming a layer stack at least partially over the at least one first contact pad, so that a surface of the at least one second contact pad facing away from the semiconductor device is free of and uncovered by the layer stack;
wherein the layer stack comprises at least a barrier layer, an adhesion layer and a metallization layer and wherein forming the layer stack comprises structuring the adhesion layer using a first etching agent, the first etching agent comprising at least HF; and wherein the metallization layer comprises a metal alloy and wherein the adhesion layer is disposed between the metallization layer and the at least one first contact pad for adhering the metal alloy of the metallization layer to the at least one first contact pad, wherein the semiconductor device further comprises a front surface on the front side of the semiconductor device and wherein the at least one first contact pad and the at least one second contact pad directly contact the front surface.

17. The method of claim 16,
wherein the barrier layer is used as an etch stop for the first etching agent.

18. The method of claim 17, further comprising:
structuring the barrier layer using a second etching agent different from the first etching agent.

19. The method of claim 18,
wherein the at least one second contact pad is used as an etch stop for the second etching agent.

20. The method of claim 18,
wherein the second etching agent comprises $H_2O_2$.

21. The method of claim 16, further comprising:
forming solder material on the metallization layer.

22. A semiconductor device, comprising:
at least one first contact pad on a front side of the semiconductor device;
at least one second contact pad on the front side of the semiconductor device;
a layer stack disposed at least partially over the at least one first contact pad, wherein the at least one second contact pad is at least partially free of the layer stack;
a solder material disposed at least partially over the metallization layer;
wherein the solder material and the metal alloy of the metallization layer comprise at least a first metal and wherein a concentration of the first metal in the metallization layer is smaller than or equal to about 80 at. %;
wherein the layer stack comprises at least an adhesion layer and a metallization layer; and
wherein the metallization layer comprises a metal alloy and wherein the adhesion layer is disposed between the metallization layer and the at least one first contact pad for adhering the metal alloy of the metallization layer to the at least one first contact pad.

23. A semiconductor device, comprising:
at least one first contact pad on a front side of the semiconductor device;
at least one second contact pad on the front side of the semiconductor device;
a layer stack disposed at least partially over the at least one first contact pad, wherein a surface of the at least one second contact pad facing away from the semiconductor device is at least partially free of and uncovered by the layer stack; and
at least one rear metallization layer on a rear side of the semiconductor device opposite to the front side of the semiconductor
wherein the layer stack comprises at least an adhesion layer and a metallization layer; and
wherein the metallization layer comprises a metal alloy and wherein the adhesion layer is disposed between the metallization layer and the at least one first contact pad for adhering the metal alloy of the metallization layer to the at least one first contact pad,
wherein the semiconductor device further comprises a front surface on the front side of the semiconductor device and wherein the at least one first contact pad and the at least one second contact pad directly contact the front surface.

24. A method for manufacturing a semiconductor device, the method comprising:
    forming at least one first contact pad on a front side of the semiconductor device and at least one second contact pad on the front side of the semiconductor device;
    forming a layer stack at least partially over the at least one first contact pad, so that a surface of the at least one second contact pad facing away from the semiconductor device is free of and uncovered by the layer stack;
    wherein the layer stack comprises at least a barrier layer, an adhesion layer and a metallization layer, the barrier layer being disposed between the adhesion layer and the at least one contact pad; and
    wherein the metallization layer comprises a metal alloy and wherein the adhesion layer is disposed between the metallization layer and the at least one first contact pad for adhering the metal alloy of the metallization layer to the at least one first contact pad,
    wherein the semiconductor device further comprises a front surface on the front side of the semiconductor device and wherein the at least one first contact pad and the at least one second contact pad directly contact the front surface.

25. A method for manufacturing a semiconductor device, the method comprising:
    forming at least one first contact pad on a front side of the semiconductor device and at least one second contact pad on the front side of the semiconductor device;
    forming a layer stack at least partially over the at least one first contact pad, so that a surface of the at least one second contact pad facing away from the semiconductor device is free of and uncovered by the layer stack;
    wherein the layer stack comprises at least a barrier layer, an adhesion layer and a metallization layer and wherein forming the layer stack comprises diffusing a first metal into the metallization layer to form the metal alloy of the metallization layer; and
    wherein the metallization layer comprises a metal alloy and wherein the adhesion layer is disposed between the metallization layer and the at least one first contact pad for adhering the metal alloy of the metallization layer to the at least one first contact pad,
    wherein the semiconductor device further comprises a front surface on the front side of the semiconductor device and wherein the at least one first contact pad and the at least one second contact pad directly contact the front surface.

* * * * *